United States Patent
Oshima et al.

(10) Patent No.: US 10,267,655 B2
(45) Date of Patent: Apr. 23, 2019

(54) CV CONVERSION AMPLIFIER AND CAPACITIVE SENSOR

(71) Applicant: Hitachi, Ltd., Tokyo (JP)

(72) Inventors: Takashi Oshima, Tokyo (JP); Makoto Takahashi, Tokyo (JP); Yuki Furubayashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/628,706

(22) Filed: Jun. 21, 2017

(65) Prior Publication Data

US 2018/0052011 A1  Feb. 22, 2018

(30) Foreign Application Priority Data

Aug. 19, 2016 (JP) .................... 2016-161461

(51) Int. Cl.
  *G01D 5/24* (2006.01)
  *H03K 17/975* (2006.01)
  *G01D 3/02* (2006.01)

(52) U.S. Cl.
  CPC .............. *G01D 5/24* (2013.01); *H03K 17/975* (2013.01); *G01D 3/02* (2013.01)

(58) Field of Classification Search
  CPC ........ G01D 5/24; G01D 5/2405; G01D 5/241; G01D 5/2412; G01D 5/2415; G01D 5/2417; G01D 3/02; G01D 3/021; G01D 3/022; G01D 3/024; H03K 17/975
  USPC ........................................................ 327/100
  See application file for complete search history.

(56) References Cited

U.S. PATENT DOCUMENTS

| | | | |
|---|---|---|---|
| 2007/0163815 A1 | 7/2007 | Ungaretti et al. | |
| 2008/0240287 A1* | 10/2008 | Yotsumoto | H04L 27/2624 375/296 |
| 2011/0310054 A1* | 12/2011 | Souchkov | G06F 3/0416 345/174 |
| 2014/0253491 A1* | 9/2014 | Kwon | G06F 3/044 345/174 |

FOREIGN PATENT DOCUMENTS

JP  2007-171171 A  7/2007

OTHER PUBLICATIONS

Mark A. Lemkin et al., "A 3-Axis Surface Micromachined ΣΔ Accelerometer", IEEE International Solid-State Circuits Conference, Feb. 7, 1997.

Mark Lemkin, et al., "A Three-Axis Micromachined Accelerometer with a CMOS Position-Sense Interface and Digital Offset-Trim Electronics", IEEE Journal of Solid-State Circuits, vol. 34, No. 4, Apr. 1999, pp. 456-468.

* cited by examiner

*Primary Examiner* — Patrick C Chen
(74) *Attorney, Agent, or Firm* — Mattingly & Malur, PC

(57) ABSTRACT

A CV conversion amplifier is provided that can secure a sufficient capacitance-to-voltage conversion gain and a sufficient amplitude range of an output voltage with a small consumption current. A capacitive sensor using the CV conversion amplifier is provided with low electric power, low noise, and a wide tolerance of input signals. The CV conversion amplifier accepts outputs, as inputs, from a first capacitance and a second capacitance whose capacitance is changed depending on a physical quantity and converts a capacitance value into a voltage.

14 Claims, 17 Drawing Sheets

CV CONVERSION AMPLIFIER AND CAPACITIVE SENSOR

TECHNICAL FIELD

The present invention relates to a CV conversion amplifier and a capacitive sensor using the same.

BACKGROUND ART

In MEMS capacitive acceleration sensors, angular velocity sensors, angle sensors, and other sensors, a capacitance-to-voltage (CV) conversion amplifier is used. The CV conversion amplifier converts a change ΔC of a capacitance value generated in an MEMS capacitive element into a voltage signal ΔV. Since the CV conversion amplifier is located in the first stage of a signal detection circuit, the CV conversion amplifier is required to have a sufficiently low noise. In order to achieve this, a large consumption current is necessary.

In order to relax the noise specifications of the subsequent circuit block and later ones, it is necessary to increase a capacitance-to-voltage conversion gain ΔV/ΔC as large as possible. However, conventionally, a problem arises in that an increase in the capacitance-to-voltage conversion gain causes a considerable decrease in the amplitude range of the output voltage of the CV conversion amplifier, or causes the faulty operation of the CV conversion amplifier.

In other words, in the case of a pseudo-differential CV conversion amplifier using two single-ended output operational amplifiers in parallel, an increase in the capacitance-to-voltage conversion gain causes the center voltage level of the output of each of the single-ended output operational amplifiers to be considerably shifted from a desired value, which is typically about a half of a power supply voltage. As a result, the amplitude range of the output voltage of the CV conversion amplifier is considerably decreased.

In the case of a fully-differential CV conversion amplifier using one fully-differential operational amplifier, an increase in the capacitance-to-voltage conversion gain causes the in-phase potential (the average potential) of the differential input of the fully-differential operational amplifier to be considerably shifted from a desired value. As a result, this causes the faulty operation of the CV conversion amplifier. When the amplitude range of the output voltage of the CV conversion amplifier is deceased, the tolerance of the input signal of the sensor is narrowed. For example, in the acceleration sensor, the range of input acceleration signals, which are normally detectable, is narrowed.

Therefore, conventionally, a capacitance for adjusting the in-phase potential is added to the input node of the operational amplifier, and hence the amplitude range of the output of the CV conversion amplifier is secured, or normal operating states are secured. Such configurations added with a capacitance for adjusting the in-phase potential are described in Patent Literature 1, Nonpatent Literature 1, or Nonpatent Literature 2, for example.

CITATION LIST

Patent Literature

Patent Literature 1: Japanese Unexamined Patent Application Publication No. 2007-171171 (Japanese Patent No. 5331304)

Nonpatent Literature

Nonpatent Literature 1: ISSCC97/SESSINO12/SENSORS/PAPER FP 12.4: "A 3-Axis Surface Micromachined ΣΔ Accelerometer"

Nonpatent Literature 2: IEEE JOURNAL OF SOLID-STATE CIRCUITS, VOL. 34, NO. 4, APRIL 1999, pp. 456-468 "A Three-Axis Micromachined Accelerometer with a CMOS Position-Sense Interface and Digital Offset-Trim Electronics"

SUMMARY OF INVENTION

Technical Problem

In the configurations added with the capacitance for adjusting the in-phase potential described above, the capacitance-to-voltage conversion gain and the amplitude range of the output voltage of the CV conversion amplifier can be secured. However, a large consumption current, which is basically required for decreasing noise, is more greatly increased due to the influence of the capacitance added for adjusting the in-phase potential. Therefore, an object of the present invention is to provide a CV conversion amplifier that can secure a capacitance-to-voltage conversion gain and the amplitude range of an output voltage with a small increase in a consumption current, and a capacitive sensor using the same with low power, low noise, and a wide tolerance of input signals.

Solution to Problem

An aspect of the present invention is a capacitive sensor including: a first capacitance, a second capacitance, a third capacitance, and a fourth capacitance; a first operational amplifier and a second operational amplifier; and a first switch, a second switch, a third switch, and a fourth switch. In the sensor, when a physical quantity to be a measurement target is substantially zero, the first capacitance and the second capacitance are a capacitance pair having substantially equal capacitance values. When a physical quantity to be a measurement target is not substantially zero, capacitance values of the first capacitance and the second capacitance are changed from the capacitance values when a physical quantity is substantially zero depending on the physical quantity to be a measurement target. Amounts of changes in capacitance values of the first capacitance and the second capacitance depending on a physical quantity to be a measurement target are values whose signs are opposite and whose absolute values are substantially equal to each other. The third capacitance and the fourth capacitance have substantially equal capacitance values. A first electrode of the first capacitance is connected to a first electrode of the second capacitance, and a first signal is supplied to the first electrodes. A second electrode of the first capacitance is connected to an inverting input terminal of the first operational amplifier. A second electrode of the second capacitance is connected to an inverting input terminal of the second operational amplifier. A first electrode and a second electrode of the third capacitance are connected to the inverting input terminal and an output of the first operational amplifier, respectively, directly or through a switch. A first electrode and a second electrode of the fourth capacitance are connected to the inverting input terminal and an output of the second operational amplifier, respectively, directly or through a switch. The first electrode of the third capacitance is connected to a first charge potential through the first switch, and the second electrode of the third capacitance is connected to a second charge potential through the second switch. The first electrode of the fourth capacitance is connected to a third charge potential through the third switch, and the second electrode of the fourth capacitance is connected to a fourth charge potential through the fourth switch. A first fixed voltage is applied to a non-inverting input terminal of the first operational amplifier, and a second fixed voltage is applied to a non-inverting input terminal of the second operational amplifier. Here, by periodically turning on the first switch and the second switch, the third capacitance is periodically charged by a difference voltage between the first charge potential and the second charge potential. By periodically turning on the third switch and the fourth switch, the fourth capacitance is periodically charged by a difference voltage between the third charge potential and the fourth charge potential.

Another aspect of the present invention is a CV conversion amplifier that accepts outputs, as inputs, from a first capacitance and a second capacitance whose capacitance is changed depending on a physical quantity and converts a capacitance value into a voltage, the CV conversion amplifier including: a first terminal connected to the first capacitance; a second terminal connected to the second capacitance; an amplifier circuit having the first terminal and the second terminal as inputs; a third capacitance and a fourth capacitance; and a first switch, a second switch, a third switch, and a fourth switch. Here, a first electrode and a second electrode of the third capacitance are connected to a first input and a first output of the amplifier circuit, respectively, directly or through a switch. A first electrode and a second electrode of the fourth capacitance are connected to a second input and a second output of the amplifier circuit, respectively, directly or through a switch. The first electrode of the third capacitance is connected to a first charge potential through the first switch, and the second electrode of the third capacitance is connected to a second charge potential through the second switch. The first electrode of the fourth capacitance is connected to a third charge potential through the third switch, and the second electrode of the fourth capacitance is connected to a fourth charge potential through the fourth switch.

Advantageous Effects of Invention

According to the present invention, there can be provided a CV conversion amplifier that can secure a capacitance-to-voltage conversion gain and the amplitude range of an output voltage with a small increase in a consumption current, and a capacitive sensor using the same with low power, low noise, and a wide tolerance of input signals.

DESCRIPTION OF EMBODIMENTS

Figure 1:
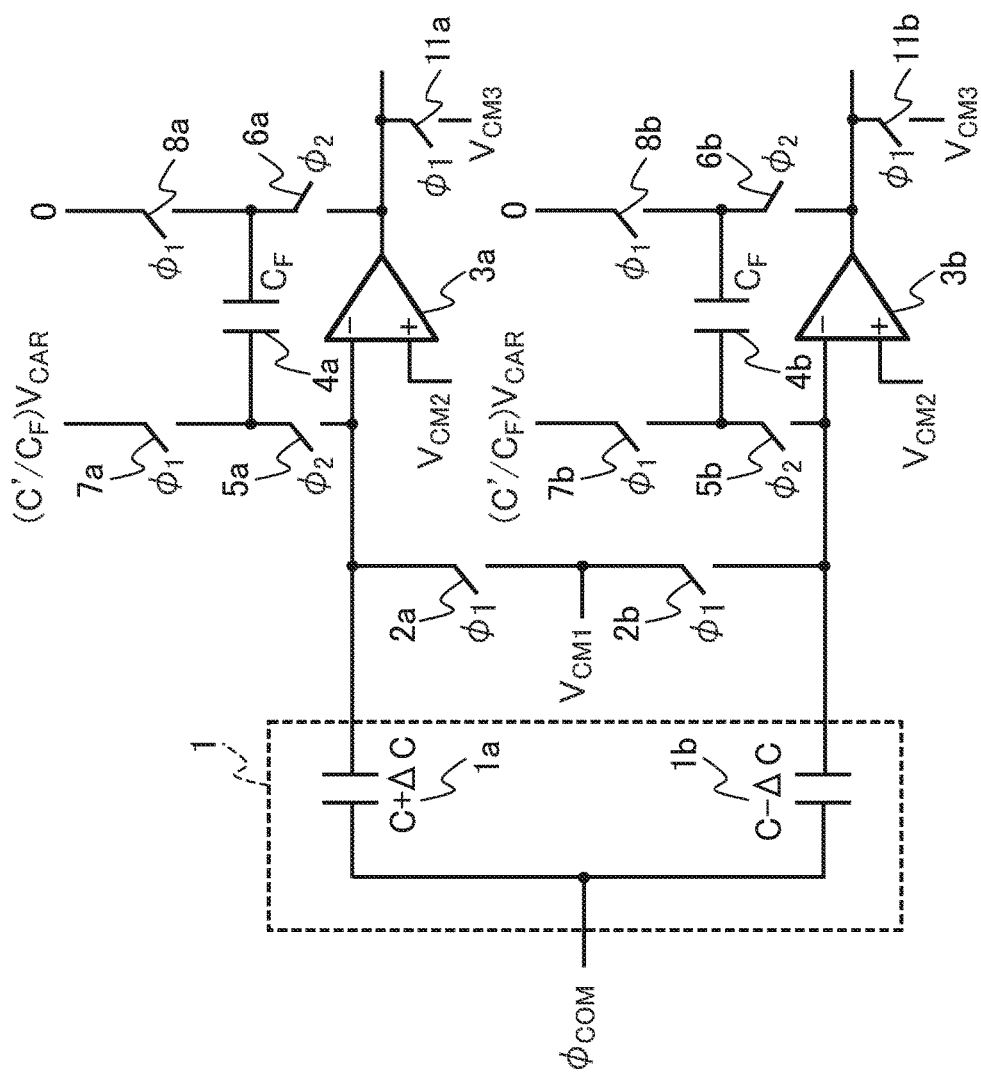
FIG. 1 is a circuit diagram of a first embodiment of the present invention.

Embodiments will be described in detail with reference to the drawings. However, the present invention is not interpreted in the limitation of the description of the embodiments below. A person skilled in the art will easily understand that specific configurations of the present invention can be modified within the scope not deviating from the idea and the gist of the present invention.

In the configuration of the present invention described below, portions having the same or similar functions are designated the same reference numerals and signs and used in different drawings in common, and the overlapping description is sometimes omitted.

In the embodiments, in the case where there is a plurality of portions that are regarded as equivalent ones, these portions are sometimes designated different numbers and reference numerals and signs after the same reference numerals and signs for distinguishing between them. However, in the case where it is unnecessary to distinguish between them specifically, different numbers and reference numerals and signs are sometimes omitted.

In the present specification and claims, notations, such as a first, a second, and a third, are provided to identify components, which do not necessarily limit the numbers and the order. The numbers to identify components are used in each context. The numbers used in one context do not always show the same configurations in another context. A component identified by a certain number sometimes serves as the function of a component identified by another number.

The positions, sizes, shapes, ranges, and other parameters of configurations shown in the specification and the drawings sometimes do not express the actual positions, sizes, shapes, ranges, and other parameters for easy understanding of the present invention. Thus, the present invention is not necessarily limited to the positions, sizes, shapes, ranges, and other parameters disclosed in the specification and the drawings.

In order to understand the configuration and effect of the embodiments, first, problems to be solved in the embodiments will be described.

Figure 15:
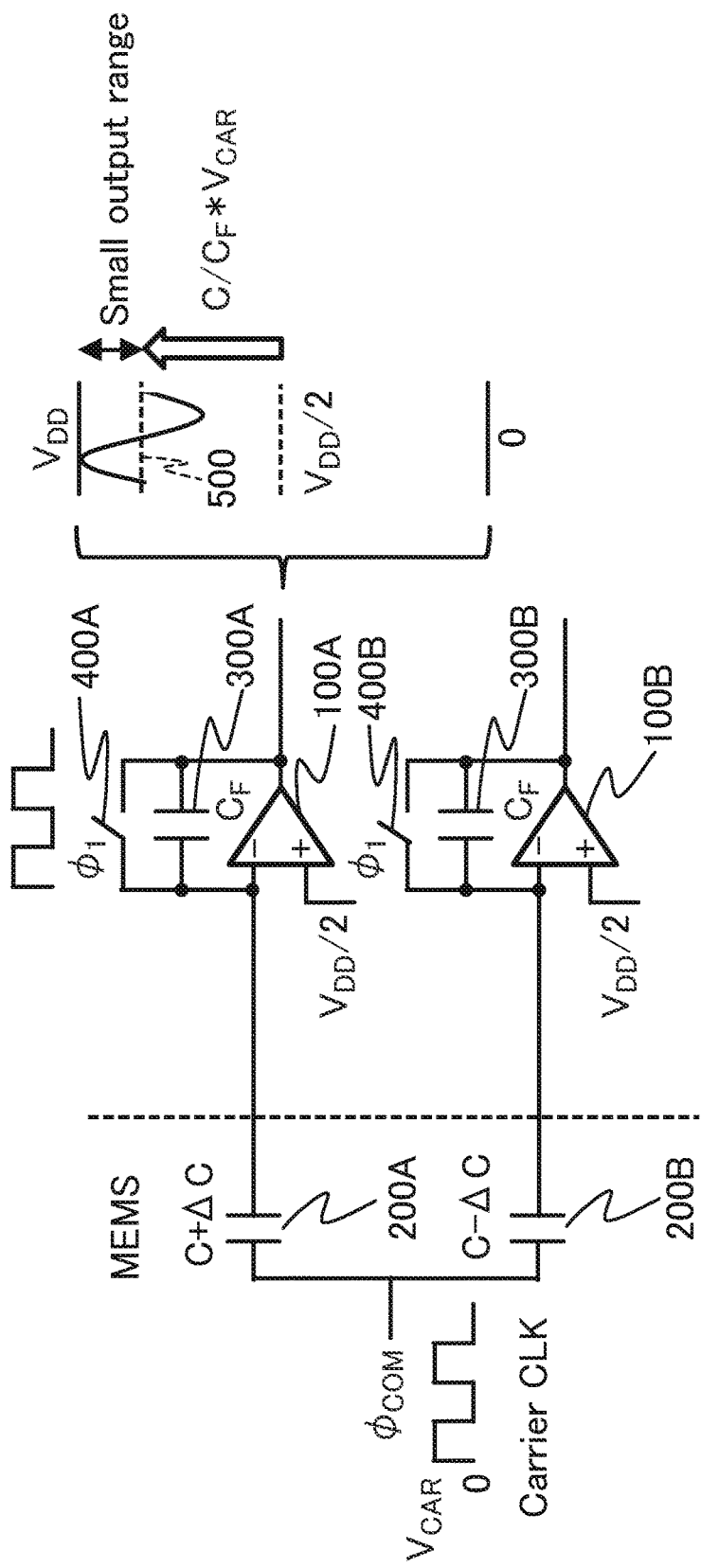
FIG. 15 is a circuit diagram for explaining problems to be solved in an embodiment.

FIG. 15 is a diagram of the configuration of a previously existing pseudo-differential CV conversion amplifier, and problems of a decrease in the amplitude range of the output voltage in that the center voltage level of the output is shifted from a desired value, which is typically about a half of a power supply voltage.

In FIG. 15, two single-ended output operational amplifiers 100A and 100B are always in a closed loop state. Thus, because of the virtual ground functions of the amplifiers, the potential of the node connected to the inverting input terminal of each of the operational amplifiers is always $V_{DD}/2$ ($V_{DD}$ is a power supply voltage).

In a period in which a carrier clock (Carrier CLK) $\phi_{COM}$ is at a high voltage (a voltage value $V_{CAR}$) and a clock signal $\phi_1$ is at a high voltage, an electric charge of $-(C+\Delta C)^*(V_{CAR}-V_{DD}/2)$ and an electric charge of $-(C-\Delta C)^*(V_{CAR}-V_{DD}/2)$ are charged on the operational amplifier-side electrodes of a pair of two detection MEMS capacitive elements 200A and 200B. Note that, the capacitance values of these two detection MEMS capacitive elements 200A and 200B are expressed by $C+\Delta C$ and $C-\Delta C$, respectively. C is the capacitance values of the two detection MEMS capacitive elements when a signal, such as an acceleration signal, is not applied to a sensor. $\Delta C$ is a change in the capacitance values of the two detection MEMS capacitive elements in the case where a signal, such as an acceleration signal, is applied to the sensor.

Since the clock signal $\phi_1$ is at a high voltage, switches 400A and 400B connected in parallel with feedback capacitive elements 300A and 300B (at a capacitance value $C_F$) of the operational amplifier 100 are in an ON-state, and two electrodes of each of the feedback capacitive elements 300A and 300B are short-circuited. As a result, electric charges on the electrodes of the feedback capacitive elements 300A and 300B are discharged to zero.

Subsequently, the carrier clock $\phi_{COM}$ and the clock signal $\phi_1$ are transitioned from a high voltage to a low voltage. Since the carrier clock $\phi_{COM}$ is at a low voltage (at zero potential), the potentials of the carrier clock-side electrodes of the two detection MEMS capacitive elements 200 are zero. Thus, an electric charge of $(C+\Delta C)^*V_{DD}/2$ and an electric charge of $(C-\Delta C)^*V_{DD}/2$ are induced on the operational amplifier-side electrodes of the two detection MEMS capacitive elements 200. As a result, an electric charge, which is a difference between the electric charge of $-(C+\Delta C)^*(V_{CAR}-V_{DD}/2)$ and the electric charge of $-(C-\Delta C)^*(V_{CAR}-V_{DD}/2)$ stored on the operational amplifier-side electrodes of the two detection MEMS capacitive elements 200 so far, is transferred from the operational amplifier input-side electrodes of the feedback capacitive elements 300 to the detection MEMS capacitive elements 200.

Since the clock signal $\phi_1$ is at a low voltage, the switches 400 connected in parallel with the feedback capacitive elements 300 are in an OFF-state, and hence the electric charge of the difference is supplied only from the feedback capacitive elements 300. The electric charges of the operational amplifier input-side electrodes of the feedback capacitive elements 300 are zero so far. Thus, eventually, an electric charge $Q_{FP}$ of the operational amplifier input-side electrode of the upper feedback capacitive element 300A is $Q_{FP} = 0 - [(C+\Delta C)^*V_{DD}/2 - \{-(C+\Delta C)^*(V_{CAR}-V_{DD}/2)\}] = -\Delta C^*V_{CAR} - C^*V_{CAR}$.

An electric charge $Q_{FN}$ of the operational amplifier input-side electrode of the lower feedback capacitive element 300B is $Q_{FN} = 0 - [(C-\Delta C)^*V_{DD}/2 - \{-(C-\Delta C)^*(V_{CAR}-V_{DD}/2)\}] = \Delta C^*V_{CAR} - C^*V_{CAR}$.

Consequently, an output $V_{OUTP}$ of the upper operational amplifier 100A and an output $V_{OUTN}$ of the lower operational amplifier 100B are as below from $V_{OUTP} = V_{DD}/2 - Q_{FP}/C_F$, and $V_{OUTN} = V_{DD}/2 - Q_{FN}/C_F$.

$$V_{OUTP} = \frac{V_{DD}}{2} + V_{CAR} \cdot \frac{C}{C_F} + V_{CAR} \cdot \frac{\Delta C}{C_F} \quad \text{[Equation 1]}$$

$$V_{OUTN} = \frac{V_{DD}}{2} + V_{CAR} \cdot \frac{C}{C_F} - V_{CAR} \cdot \frac{\Delta C}{C_F} \quad \text{[Equation 2]}$$

A differential output $V_{OUT}$ $(=V_{OUTP}-V_{OUTN})$ and an output in-phase voltage level $V_{CMO}$ $(=(V_{OUTP}+V_{OUTN})/2)$ of the CV conversion amplifier are as below.

$$V_{OUT} = 2V_{CAR} \cdot \frac{\Delta C}{C_F} \quad \text{[Equation 3]}$$

$$V_{CMO} = \frac{V_{DD}}{2} + V_{CAR} \cdot \frac{C}{C_F} \quad \text{[Equation 4]}$$

Thus, an output in-phase voltage level $V_{CMO}$ 500 is shifted from $V_{DD}/2$, which is a desired value, by $V_{CAR}*C/C_F$. In order to increase the capacitance-to-voltage conversion gain, the feedback capacitance value $C_F$ is not allowed to be a large value, and hence the shift of $V_{CAR}*C/C_F$ becomes a large voltage. Thus, the amplitude range of the output voltage of the CV conversion amplifier is considerably decreased.

Figure 16:
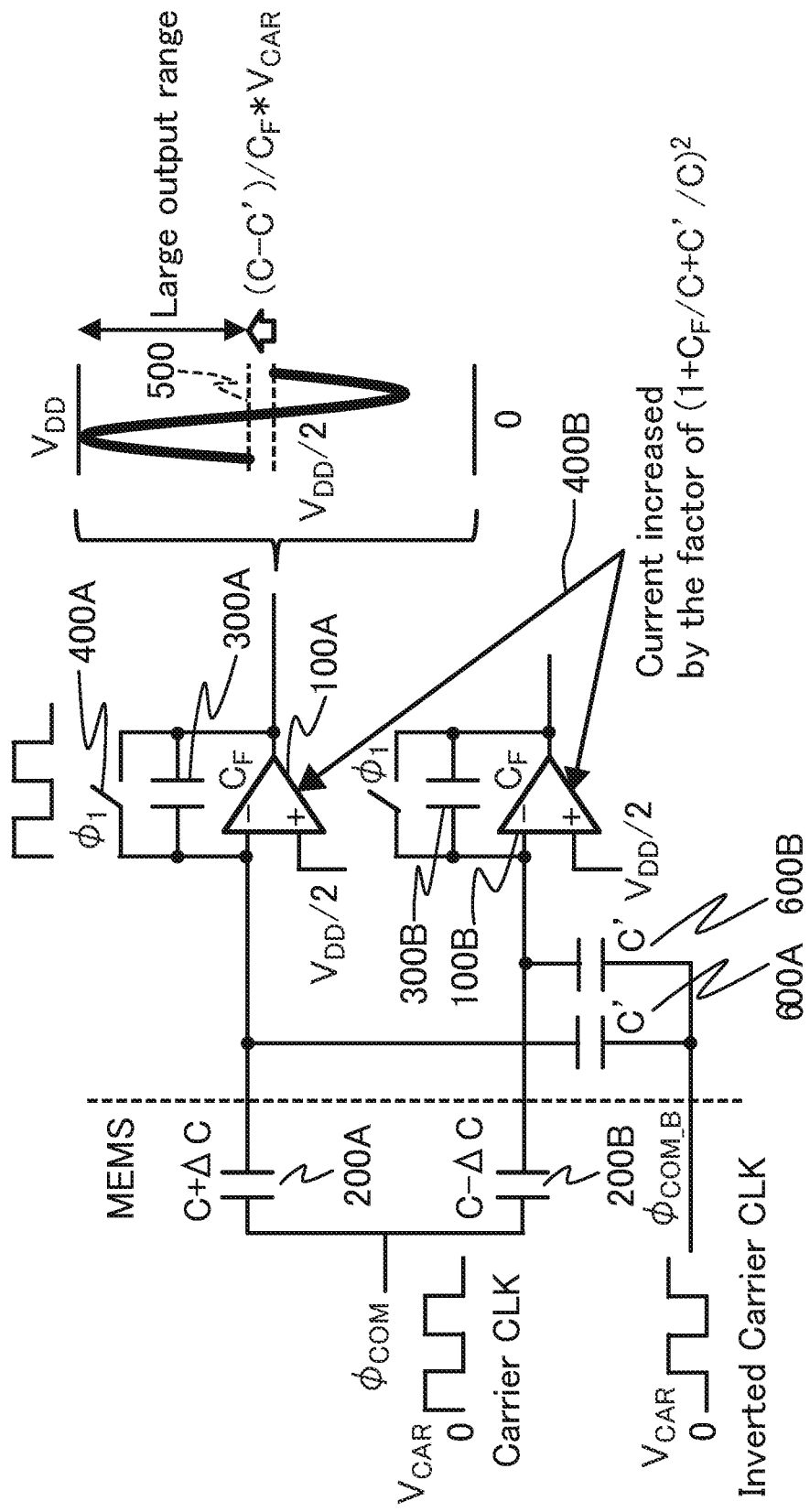
FIG. 16 is a circuit diagram for explaining problems to be solved in an embodiment.

FIG. 16 shows a comparative example in the case of applying a method for compensating a shift of the center voltage level of the output of an operational amplifier using a capacitance for adjusting the in-phase potential, which is conventionally known. In FIG. 16, in addition to the configuration of FIG. 15, two capacitive elements 600A and 600B (at a capacitance value C') for adjusting the in-phase potential are connected to nodes connected to the inverting input terminals of two operational amplifiers 100, and the other electrodes of the two capacitive elements 600 (at the capacitance value C') are connected to an inverted carrier clock $\phi_{COM\_B}$.

Similarly to FIG. 15, in FIG. 16, the two single-ended output operational amplifiers 100 are always in a closed loop state. Thus, because of the virtual ground functions of the amplifiers, the potential of the node connected to the inverting input terminal of the operational amplifier is always $V_{DD}/2$ ($V_{DD}$ is a power supply voltage).

Similarly to FIG. 15, in a period in which a carrier clock (Carrier CLK) $\phi_{COM}$ is at a high voltage (a voltage value $V_{CAR}$) and a clock signal $\phi_1$ is at a high voltage, an electric charge of $-(C+\Delta C)^*(V_{CAR}-V_{DD}/2)$ and an electric charge of $-(C-\Delta C)^*(V_{CAR}-V_{DD}/2)$ are charged on the operational amplifier-side electrodes of a pair of two detection MEMS capacitive elements 200. Electric charges on the electrodes of feedback capacitive elements 300 are discharged to zero.

In the example of FIG. 16, in the two capacitive elements 600 for adjusting the in-phase potential, a potential of $V_{DD}/2$ is applied to the operational amplifier-side electrodes, and $\phi_{COM\_B}$ at a low voltage (zero potential) is applied to the inverted carrier clock-side electrodes. Thus, an electric charge of $C'*V_{DD}/2$ is charged on both of the operational amplifier-side electrodes of the two capacitive elements 600 for adjusting the in-phase potential.

Subsequently, the carrier clock $\phi_{COM}$ and the clock signal $\phi_1$ are transitioned from a high voltage to a low voltage. Since the carrier clock $\phi_{COM}$ is at a low voltage (at zero potential), the potentials of the carrier clock-side electrodes of the two detection MEMS capacitive elements 200 are zero. Thus, an electric charge of $(C+\Delta C)*V_{DD}/2$ and an electric charge of $(C-\Delta C)*V_{DD}/2$ are induced on the operational amplifier-side electrodes of the two detection MEMS capacitive elements 200. As a result, an electric charge, which is a difference between the electric charge of $-(C+\Delta)*(V_{CAR}-V_{DD}/2)$ and the electric charge of $-(C-\Delta C)*(V_{CAR}-V_{DD}/2)$ stored on the operational amplifier-side electrodes of the two detection MEMS capacitive elements 200 so far, is absorbed by the detection MEMS capacitive elements. The charge amounts to be absorbed are:

$(C+\Delta C)*V_{DD}/2 - \{-(C+\Delta C)*(V_{CAR}-V_{DD}/2)\} = (C+\Delta C)*V_{CAR}$; and $(C-\Delta C)*V_{DD}/2 - \{-(C-\Delta C)*(V_{CAR}-V_{DD}/2)\} = (C-\Delta C)*V_{CAR}$.

On the other hand, since the inverted carrier clock $\phi_{COM\_B}$ is transitioned from a low voltage to a high voltage (at the voltage value $V_{CAR}$), an electric charge of $C'*(V_{DD}/2-V_{CAR})$ is induced on both of the two capacitive elements 600 for adjusting the in-phase potential. As a result, an electric charge, which is a difference from the electric charge of $C'*V_{DD}/2$ stored on the two capacitive elements 600 so far, is discharged from the capacitive elements 600.

The charge amount to be discharged from both of the two capacitive elements 600 is $C'*V_{DD}/2 - C'*(V_{DD}/2-V_{CAR}) = C'*V_{CAR}$.

The charge amounts transferred from the feedback capacitive elements 300 are a difference between the charge amount to be absorbed and the charge amount to be discharged.

Eventually, in FIG. 16, an electric charge $Q_{FP}$ of the operational amplifier input-side electrode of the upper feedback capacitive element 300A is $Q_{FP} = 0 - \{(C+\Delta C)*V_{CAR} - C'*V_{CAR}\} = -\Delta C*V_{CAR} - (C-C')*V_{CAR}$.

An electric charge $Q_{FN}$ of the operational amplifier input-side electrode of the lower feedback capacitive element 300B is $Q_{FN} = 0 - \{(C-\Delta C)*V_{CAR} - C'*V_{CAR}\} = \Delta C*V_{CAR} - (C-C')*V_{CAR}$.

Therefore, the output $V_{OUTP}$ of the upper operational amplifier 100A and the output $V_{OUTN}$ of the lower operational amplifier 100B are as below from $V_{OUTP} = V_{DD}/2 - Q_{FP}/C_F$, and $V_{OUTN} = V_{DD}/2 - Q_{FN}/C_F$.

$$V_{OUTP} = \frac{V_{DD}}{2} + V_{CAR} \cdot \frac{C-C'}{C_F} + V_{CAR} \cdot \frac{\Delta C}{C_F} \quad \text{[Equation 5]}$$

$$V_{OUTN} = \frac{V_{DD}}{2} + V_{CAR} \cdot \frac{C-C'}{C_F} - V_{CAR} \cdot \frac{\Delta C}{C_F} \quad \text{[Equation 6]}$$

A differential output $V_{OUT}$ ($=V_{OUTP}-V_{OUTN}$) and an output in-phase voltage level $V_{CMO}$ ($=(V_{OUTP}+V_{OUTN})/2$) of the CV conversion amplifier are as below. Note that, as expressed in Equations 5 and 6, the output in-phase voltage level $V_{CMO}$ 500 is also the center voltage level of the output of the upper and lower operational amplifiers.

$$V_{OUT} = 2V_{CAR} \cdot \frac{\Delta C}{C_F} \quad \text{[Equation 7]}$$

$$V_{CMO} = \frac{V_{DD}}{2} + V_{CAR} \cdot \frac{C-C'}{C_F} \quad \text{[Equation 8]}$$

Thus, the capacitance value C' of the capacitance 600 for adjusting the in-phase potential is selected so as to be equal to the MEMS capacitance value C (i.e., C'=C). Consequently, the second right-hand term in Equation 8 can be zero, and hence the output in-phase voltage level $V_{CMO}$ can be set to $V_{DD}/2$, which is a desired value.

However, as illustrated in FIG. 16, the consumption current necessary for the operational amplifier is increased by a factor of about $(1+C_F/C+C'/C)^2$. For example, when C'=C and $C_F/C=\frac{1}{4}$, the consumption current necessary for the operational amplifier is increased by 3.2 times because of the presence of C'. A large consumption current is basically required for the operational amplifiers of the CV conversion amplifier in order to decrease noise. Thus, it is thought that a 3.2-time increase in the consumption current gives a serious impact to the consumption current of the entire sensor.

Note that, in FIGS. 15 and 16, the output waveform of the operational amplifier is depicted by a sine wave. This is because the waveform of the signal $\Delta C$ is set to a sine wave for convenience of explanation. Precisely, the waveforms of the output voltages of the operational amplifiers are voltage waveforms in which in the half period in which the clock signal $\phi_1$ is at a high voltage, the voltage is at $V_{DD}/2$ and in the half period in which the clock signal $\phi_1$ is at a low voltage, the voltage waveform proportional to the signal $\Delta C$ is superposed on the center voltage level of the output, i.e., on the output in-phase voltage level $V_{CMO}$ (Equation 4).

Instead that the electric charge of the feedback capacitive element of the operational amplifier is discharged to zero in each half period as in the previously existing techniques, in a capacitive sensor or a CV conversion amplifier described in embodiments below, feedback capacitive elements are charged at a suitable charging voltage in each half period, for example, and hence a shift of the center voltage level of the output of operational amplifier is compensated to set a suitable center voltage level. In order to achieve this, in a typical example, the feedback capacitive element is connected to a charging potential through a switch.

First Embodiment

FIG. 1 shows a first embodiment of the present invention. This is an example in the case of a pseudo-differential CV conversion amplifier. First, configurations will be described.

A capacitive MEMS 1 includes two detection MEMS capacitive elements 1a and 1b. One of the electrodes of each of the detection MEMS capacitive elements 1a and 1b is a movable electrode that is mechanically movable. The movable electrodes of the detection MEMS capacitive elements 1a and 1b are both connected to a carrier clock $\phi_{COM}$. The other electrodes (fixed electrodes) are connected to the inverting input terminals of operational amplifiers 3a and 3b. The other electrodes are connected to a voltage $V_{CM1}$ through sampling switches 2a and 2b.

The turning on and off of the sampling switches 2a and 2b is controlled by a clock signal $\phi_1$. Between the inverting input terminal and the output terminal of the operational amplifier 3a, a feedback capacitive element 4a (at a capacitance value $C_F$) is connected through an input-side feedback switch 5a and an output-side feedback switch 6a. Similarly, between the inverting input terminal and the output terminal of the operational amplifier 3b, a feedback capacitive element 4b (at a capacitance value $C_F$) is connected through an input-side feedback switch 5b and an output-side feedback switch 6b. The turning on and off of the input-side feedback switches 5a and 5b and the output-side feedback switches 6a and 6b is controlled by a clock signal $\phi_2$. Note that, depending upon circumstances, a configuration may be possible in which the input-side feedback switches 5a and 5b and the output-side feedback switches 6a and 6b are omitted and the operational amplifiers 3a and 3b and the feedback capacitive elements 4a and 4b are directly connected to each other.

The operational amplifier input-side electrode of the feedback capacitive element 4a is connected to a charging voltage through a forward charging switch 7a. The operational amplifier output-side electrode is connected to a ground (at zero potential) through a forward charging switch 8a. Similarly, the operational amplifier input-side electrode of the feedback capacitive element 4b is connected to the charging voltage through a forward charging switch 7b. The operational amplifier output-side electrode is connected to the ground (at zero potential) through a forward charging switch 8b. The turning on and off of the forward charging switches 7a, 7b, 8a, and 8b is controlled by the clock signal $\phi_1$. The non-inverting input terminals of the operational amplifiers 3a and 3b are connected to a voltage $V_{CM2}$. The outputs of the operational amplifiers 3a and 3b are connected to a voltage $V_{CM3}$ through output reset switches 11a and 11b. The turning on and off of the output reset switches 11a and 11b is controlled by the clock signal $\phi_1$.

Figure 2:
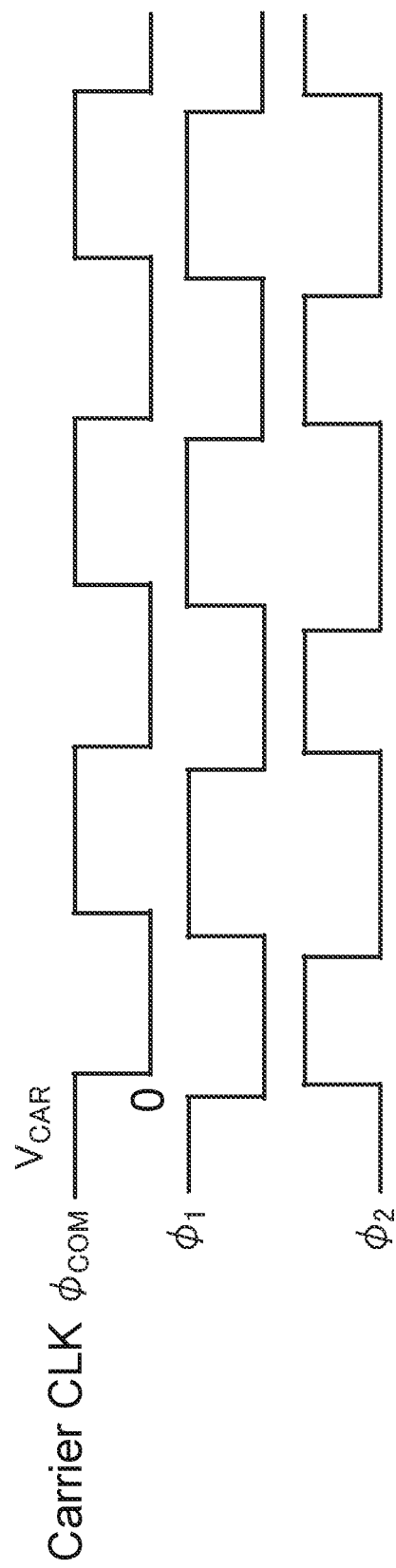
FIG. 2 is an operation timing chart of the first embodiment of the present invention.

Referring to FIG. 2, the operation will be described. In an operation timing chart in FIG. 2, in a period in which the carrier clock $\phi_{COM}$ is at a high voltage (a voltage value $V_{CAR}$) and the clock signal $\phi_1$ is at a high voltage, the sampling switches 2a and 2b are turned on, an electric charge of $-(C+\Delta C)*(V_{CAR}-V_{CM1})$ is charged on the operational amplifier-side electrode of the detection MEMS capacitive element 1a, and an electric charge of $-(C-\Delta C)*(V_{CAR}-V_{CM1})$ is charged on the operational amplifier-side electrode of the detection MEMS capacitive element 1b.

Here, the capacitance value of the detection MEMS capacitive element 1a is $C+\Delta C$, and the capacitance value of the detection MEMS capacitive element 1b is $C-\Delta C$. The movable electrode of the detection MEMS capacitive element 1a and the movable electrode of the detection MEMS capacitive element 1b are mechanically coupled to each other so that the movable electrodes integrally move. The movable electrodes function as one weight (a mass body). When a signal such as an acceleration signal is not applied to the sensor, force such as inertial force does not act on the weight. Thus, the weight, i.e., the movable electrode of the detection MEMS capacitive element 1a and the movable electrode of the detection MEMS capacitive element 1b are located at initial sites. The electrode structure is designed so that the distance between the movable electrode and the fixed electrode of the detection MEMS capacitive element 1a is equal to the distance between the movable electrode and the fixed electrode of the detection MEMS capacitive element 1b at the initial sites. Hence, the capacitance value of the detection MEMS capacitive element 1a and the capacitance value of the detection MEMS capacitive element 1b are equal to each other, and the values are C.

When a signal such as an acceleration signal is applied to the sensor, the weight receives force such as inertial force which is proportional to the signal, such as an acceleration signal. Thus, the position of the weight, i.e., the positions of the movable electrode of the detection MEMS capacitive element 1a and the movable electrode of the detection MEMS capacitive element 1b are integrally displaced proportional to the signal, such as an acceleration signal. Accordingly, when the movable electrode of the detection MEMS capacitive element 1a is displaced so as to come close to the fixed electrode of the detection MEMS capacitive element 1a, the movable electrode of the detection MEMS capacitive element 1b conversely moves away from the fixed electrode of the detection MEMS capacitive element 1b by the same displaced amount. When the movable electrode of the detection MEMS capacitive element 1a is displaced so as to move away from the fixed electrode of the detection MEMS capacitive element 1a, the movable electrode of the detection MEMS capacitive element 1b conversely comes close to the fixed electrode of the detection MEMS capacitive element 1b by the same displaced amount. Suppose that the displaced amount, i.e., a change in the capacitance value caused by the amount of a change in the gap between the electrodes is $\Delta C$, as described above, the capacitance value of the detection MEMS capacitive element 1a is $C+\Delta C$, and the capacitance value of the detection MEMS capacitive element 1b is $C-\Delta C$.

During the period in which the clock signal $\phi_1$ is at a high voltage, the forward charging switches 7a and 8a are turned on. Thus, the operational amplifier input-side electrode of the feedback capacitive element 4a is connected to the charging voltage, and the operational amplifier output-side electrode is connected to the ground (at zero potential). At this time, since the clock signal $\phi_2$ is at a low voltage, the input-side feedback switch 5a and the output-side feedback switch 6a are off, and the operational amplifier 3a is in an open loop state. Similarly, the forward charging switches 7b and 8b are turned on. Thus, the operational amplifier input-side electrode of the feedback capacitive element 4b is connected to the charging voltage, and the operational amplifier output-side electrode is connected to the ground (at zero potential). At this time, since the clock signal $\phi_2$ is at a low voltage, the input-side feedback switch 5b and the output-side feedback switch 6b are off, and the operational amplifier 3b is in an open loop state. Therefore, when the charging voltage is $(C'/C_F)V_{CAR}$, an electric charge of $C'*V_{CAR}$ is charged on both of the operational amplifier input-side electrodes of the feedback capacitive elements 4a and 4b.

The voltages of the inverting input terminals of the operational amplifiers 3a and 3b are at $V_{CM1}$, the voltages of the non-inverting input terminals are at $V_{CM2}$, and the operational amplifiers are in the open loop state. Thus, the output voltages of the operational amplifiers 3a and 3b are to swing to a voltage which a voltage difference ($V_{CM2}-V_{CM1}$) is multiplied by a large open loop gain of the operational amplifier, which is typically a few hundred times to several tens of thousands times greater. Usually, the voltages are often set to $V_{CM1}=V_{CM2}=V_{DD}/2$ ($V_{DD}$ is a power supply voltage). Actually, the voltages of the inverting input terminals of the operational amplifiers 3a and 3b are slightly shifted from $V_{CM1}$ due to the influence of the ON resistances of the sampling switches 2a and 2b. Consequently, the outputs of the operational amplifiers 3a and 3b are still to swing to a relatively large voltage value. Also in this case, the present invention effectively functions. In the embodiment, the output reset switches 11a and 11b, which are connected to the outputs of the operational amplifiers 3a and 3b, are turned on. Thus, the outputs of the operational amplifiers 3a and 3b are both connected to the voltage $V_{CM3}$, and the output voltage values are fixed to $V_{CM3}$.

Note that, as described later, $V_{CM3}$ only has to be set to a suitable voltage value, taking into account of the viewpoint whether the transient response voltage levels generated at the nodes in the CV conversion amplifier exceed the withstand voltages of MOS transistors configuring the switches in the transition of the clock signal $\phi_2$ to a high voltage, the viewpoint whether the transient response voltage level causes a leakage current on a switch that has to be off, and the viewpoint of the transfer rate of the electric charge generated in the transition of the clock signal $\phi_2$ to a high voltage.

In the operation timing chart in FIG. 2, at the instant in time at which the clock signal $\phi_1$ is transitioned from a high voltage to a low voltage, the sampling switches 2a and 2b are turned off. Thus, the electric charge of $-(C+\Delta C)^*(V_{CAR}-V_{CM1})$ and the electric charge of $-(C-\Delta C)^*(V_{CAR}-V_{CM1})$ which have been charged on the operational amplifier-side electrodes of the detection MEMS capacitive elements 1a and 1b, respectively, are fixed on these electrodes. At the instant in time above, the forward charging switches 7a, 8a, 7b, and 8b are also turned off. Thus, the electric charge of $C'^*V_{CAR}$, which has been charged on the operational amplifier input-side electrodes of the feedback capacitive elements 4a and 4b, is also fixed.

As illustrated in the operation timing chart in FIG. 2, after the transition of the clock signal $\phi_1$ to a low voltage, the clock signal $\phi_2$ is transitioned to a high voltage after a lapse of a short non-overlap period, which is a period in which the clock signals $\phi_1$ and $\phi_2$ are both at a low voltage. Thus, the input-side feedback switch 5a and the output-side feedback switch 6a are turned on, and the feedback capacitive element 4a is inserted between the input and the output of the operational amplifier 3a. Consequently, the operational amplifier 3a is turned to a closed loop state. Similarly, the input-side feedback switch 5b and the output-side feedback switch 6b are turned on, and the feedback capacitive element 4b is inserted between the input and the output of the operational amplifier 3b. Consequently, the operational amplifier 3b is turned to a closed loop state.

Therefore, because of the virtual ground operation of the operational amplifiers in the closed loop state, the potentials of the inverting input terminals of the operational amplifiers 3a and 3b, i.e., the potentials of the operational amplifier-side electrodes of the detection MEMS capacitive elements 1a and 1b are at $V_{CM2}$. On the other hand, as illustrated in the operation timing chart in FIG. 2, the carrier clock $\phi_{COM}$ is transitioned to a low voltage (zero potential). Thus, the potentials of the carrier clock-side electrodes of the detection MEMS capacitive elements 1a and 1b are zero. Hence, an electric charge of $(C+\Delta C)^*V_{CM2}$ and an electric charge of $(C-\Delta C)^*V_{CM2}$ are induced on the operational amplifier-side electrodes of the detection MEMS capacitive elements 1a and 1b. As a result, an electric charge, which is a difference between the electric charge of $-(C+\Delta C)^*(V_{CAR}-V_{CM1})$ and the electric charge of $-(C-\Delta C)^*(V_{CAR}-V_{CM1})$ having been fixed on the operational amplifier-side electrodes of the detection MEMS capacitive elements 1a and 1b, respectively, is transferred from the operational amplifier input-side electrodes of the feedback capacitive elements 4a and 4b to the detection MEMS capacitive elements 1a and 1b.

The electric charge of $C'^*V_{CAR}$ has been fixed on both of the operational amplifier input-side electrodes of the feedback capacitive elements 4a and 4b at the instant in time of the transition of the clock signal $\phi_1$ to a low voltage. Thus, eventually, an electric charge $Q_{FP}$ of the operational amplifier input-side electrode of the feedback capacitive element 4a is $$Q_{FP}=C'^*V_{CAR}-[(C+\Delta C)^*V_{CM2}-\{-(C+\Delta C)^*(V_{CAR}-V_{CM1})\}]=-\Delta C^*(V_{CAR}-V_{CM1}+V_{CM2})-(C-C')^*V_{CAR}-C(V_{CM2}-V_{CM1}).$$

An electric charge $Q_{FN}$ of the operational amplifier input-side electrode of the feedback capacitive element 4b is $$Q_{FN}=C'^*V_{CAR}-[(C-\Delta C)^*V_{CM2}-\{-(C-\Delta C)^*(V_{CAR}-V_{CM1})\}]=\Delta C^*(V_{CAR}-V_{CM1}+V_{CM2})-(C-C')^*V_{CAR}-C(V_{CM2}-V_{CM1}).$$

Therefore, outputs $V_{OUTP}$ and $V_{OUTN}$ of the operational amplifiers 3a and 3b are expressed as below from $V_{OUTP}=V_{CM2}-Q_{FP}/C_F$, and $V_{OUTN}=V_{CM2}-Q_{FN}/C_F$.

$$V_{OUTP} = V_{CM2} + V_{CAR} \cdot \frac{C-C'}{C_F} + (V_{CM2} - V_{CM1}) \cdot \frac{C}{C_F} + (V_{CAR} - V_{CM1} + V_{CM2}) \cdot \frac{\Delta C}{C_F} \quad \text{[Equation 9]}$$

$$V_{OUTN} = V_{CM2} + V_{CAR} \cdot \frac{C-C'}{C_F} + (V_{CM2} - V_{CM1}) \cdot \frac{C}{C_F} - (V_{CAR} - V_{CM1} + V_{CM2}) \cdot \frac{\Delta C}{C_F} \quad \text{[Equation 10]}$$

A differential output $V_{OUT}$ ($=V_{OUTP}-V_{OUTN}$) and an output in-phase voltage level $V_{CMO}$ ($=(V_{OUTP}+V_{OUTN})/2$) of the CV conversion amplifier are as below.

$$V_{OUT} = 2(V_{CAR} - V_{CM1} + V_{CM2}) \cdot \frac{\Delta C}{C_F} \quad \text{[Equation 11]}$$

$$V_{CMO} = V_{CM2} + V_{CAR} \cdot \frac{C-C'}{C_F} + (V_{CM2} - V_{CM1}) \cdot \frac{C}{C_F} \quad \text{[Equation 12]}$$

In order to maximize the capacitance-to-voltage conversion gain $\Delta V/\Delta C$ ($=V_{OUT}/\Delta C$), the voltage is typically set to $V_{CM1}=V_{CM2}$. Thus, the noise specifications of analog circuit blocks (an amplifier and an A/D converter) in the subsequent stage of the CV conversion amplifier can be relaxed, and hence the electric power and sizes of these circuits can be decreased. In the case of $V_{CM1}=V_{CM2}=V_{DD}/2$, the differential output and the output in-phase voltage level $V_{CMO}$ of the CV conversion amplifier are as below.

$$V_{OUT} = 2V_{CAR} \cdot \frac{\Delta C}{C_F} \quad \text{[Equation 13]}$$

$$V_{CMO} = \frac{V_{DD}}{2} + V_{CAR} \cdot \frac{C-C'}{C_F} \quad \text{[Equation 14]}$$

As described above, in the embodiment, C'=C is preferably selected, i.e., the charging voltage is set to $(C/C_F)V_{CAR}$. Thus, the second right-hand term in Equation 14 can be zero. As a result, the output in-phase voltage level $V_{CMO}$ can be $V_{DD}/2$, which is a desired value. Consequently, a sufficiently wide amplitude range of the output voltage of the CV conversion amplifier can be secured. Even in the case where C' is unequal to C, when the second right-hand term in Equation 14 can be made small, the output in-phase voltage level $V_{CMO}$ can be brought close to $V_{DD}/2$, which is a desired value, based on this small value.

Note that, Equations 9 to 14 express the voltages in about a half period in which the clock signal $\phi_2$ is at a high voltage, and the output voltages $V_{OUTP}$ and $V_{OUTN}$ of the operational amplifiers 3a and 3b in this period are processed (amplified or subjected to A/D conversion) by circuit blocks (an amplifier and an A/D converter) subsequent to the CV conversion amplifier. Also in equations described in embodiments below, the concept described above is similar.

Second Embodiment

Figure 3:
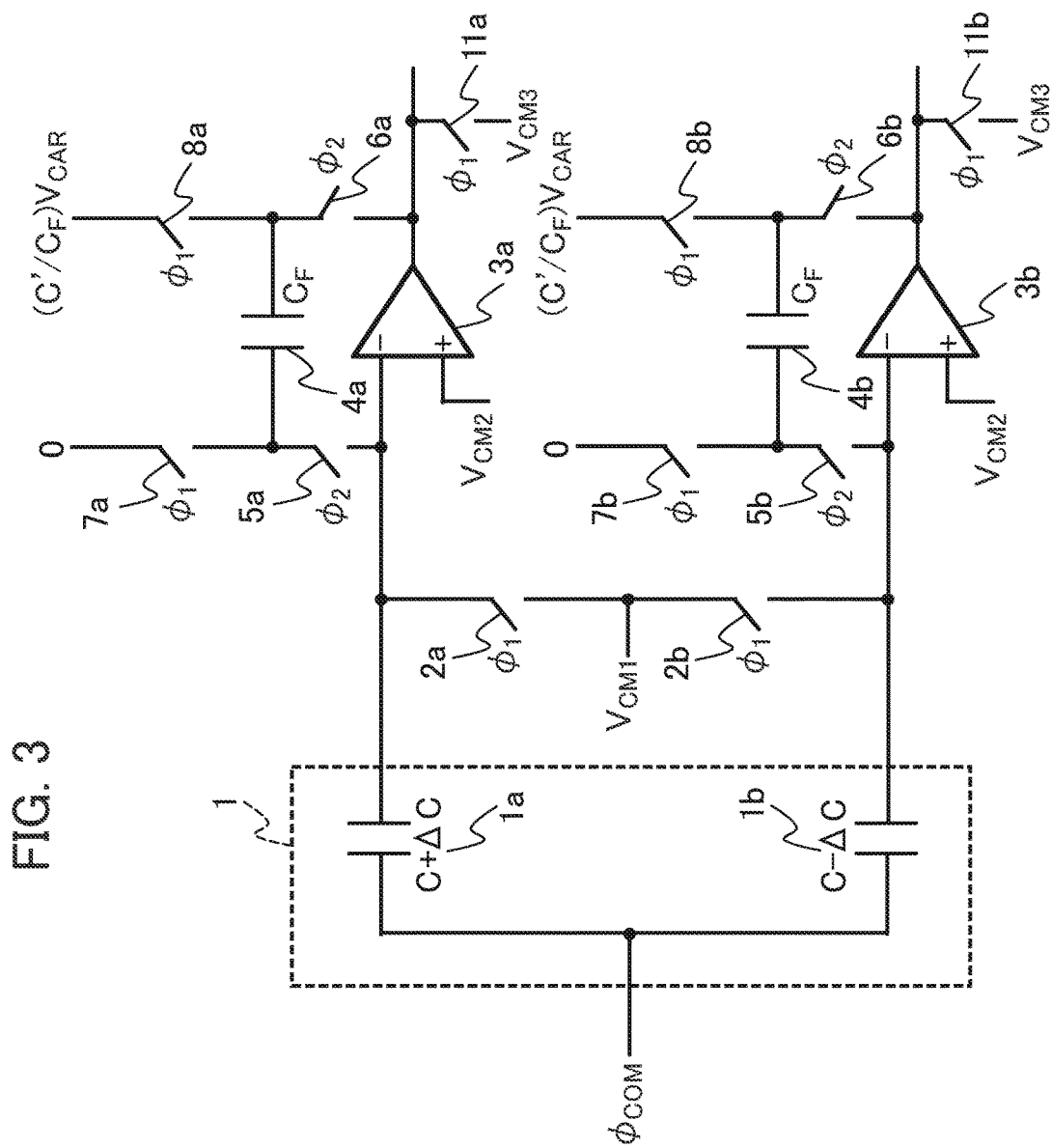
FIG. 3 is a circuit diagram of a second embodiment of the present invention.
Figure 4:
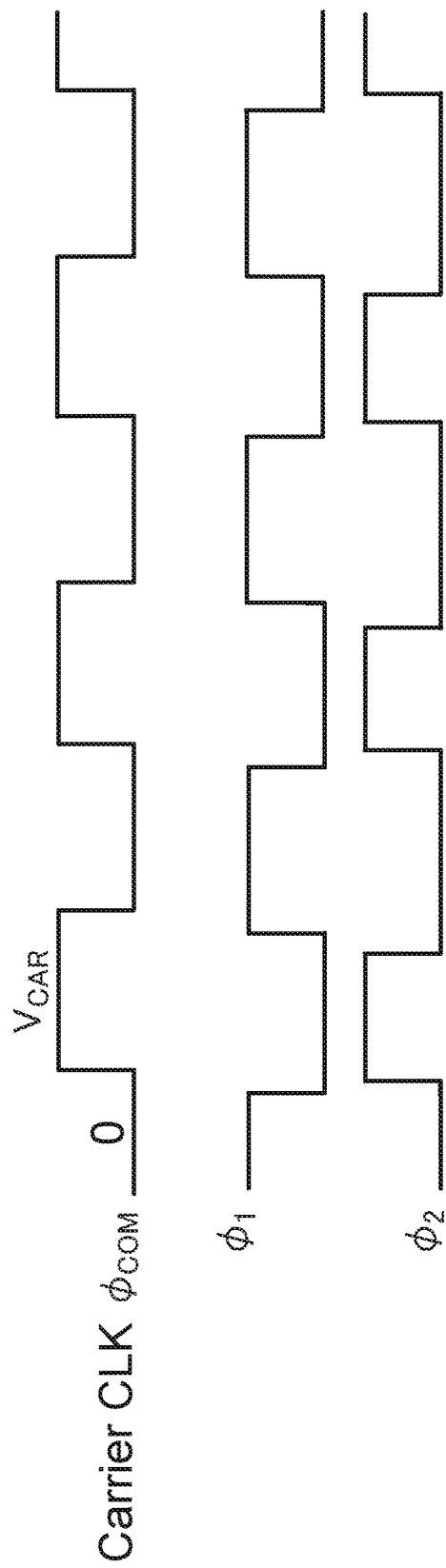
FIG. 4 is an operation timing chart of the second embodiment of the present invention.

FIG. 3 is a diagram showing a second embodiment of the present invention. FIG. 4 is an operation timing chart of the second embodiment. The second embodiment is different from the first embodiment in that as illustrated in FIG. 4, the carrier clock $\phi_{COM}$ is at a low voltage when the clock signal $\phi_1$ is at a high voltage and as illustrated in FIG. 3, forward charging switches 7a and 7b are connected to the ground and forward charging switches 8a and 8b are connected to the charging voltage correspondingly.

First, in configurations, differences from the first embodiment will be mainly described. Configurations similar to the configurations of the first embodiment are designated the same reference numerals and signs, and the description is omitted. In the second embodiment, the operational amplifier input-side electrode of a feedback capacitive element 4a is connected to the ground (at zero potential) through the forward charging switch 7a, and the operational amplifier output-side electrode is connected to the charging voltage through the forward charging switch 8a. Similarly, the operational amplifier input-side electrode of a feedback capacitive element 4b is connected to the ground (at zero potential) through the forward charging switch 7b, and the operational amplifier output-side electrode is connected to the charging voltage through the forward charging switch 8b. The other configurations are basically the same as the configurations of FIG. 1.

Referring to FIG. 4, the operation will be described. In the operation, portions different from the first embodiment will be described, and the description of similar portions is omitted. In the operation timing chart of FIG. 4, the high level and the low level of the signal $V_{CAR}$ are reversed from the levels in the timing chart in FIG. 2 of the first embodiment. In the operation timing chart of FIG. 4, in a period in which the carrier clock $\phi_{COM}$ is at a low voltage (at zero potential) and the clock signal $\phi_1$ is at a high voltage, sampling switches 2a and 2b are turned on, an electric charge of $(C+\Delta C)*V_{CM1}$ is charged on the operational amplifier-side electrode of a detection MEMS capacitive element 1a, and an electric charge of $(C-\Delta C)*V_{CM1}$ is charged on the operational amplifier-side electrode of a detection MEMS capacitive element 1b.

During the period in which the clock signal $\phi_1$ is at a high voltage, the forward charging switches 7a and 8a are turned on. Thus, the operational amplifier input-side electrode of the feedback capacitive element 4a is connected to the ground (at zero potential), and the operational amplifier output-side electrode is connected to the charging voltage. At this time, since the clock signal $\phi_2$ is at a low voltage, an input-side feedback switch 5a and an output-side feedback switch 6a are turned off, and an operational amplifier 3a is in an open loop state. Similarly, the forward charging switches 7b and 8b are turned on. Thus, the operational amplifier input-side electrode of the feedback capacitive element 4b is connected to the ground (at zero potential), and the operational amplifier output-side electrode is connected to the charging voltage. At this time, since the clock signal $\phi_2$ is at a low voltage, an input-side feedback switch 5b and an output-side feedback switch 6b are turned off, and an operational amplifier 3b is in an open loop state.

Therefore, when the charging voltage is $(C'/C_F)V_{CAR}$, an electric charge of $-C'^*V_{CAR}$ is charged on both of the operational amplifier input-side electrodes of the feedback capacitive elements 4a and 4b. The voltages of the inverting input terminals of the operational amplifiers 3a and 3b are at $V_{CM1}$, the voltages of the non-inverting input terminals are at $V_{CM2}$, and the operational amplifiers are in the open loop state. Thus, this point is similar to the first embodiment that the outputs of the operational amplifiers 3a and 3b are to swing to a relatively large voltage value. Note that, $V_{CM3}$ only has to be set to a suitable voltage value by a method similar to the method in the first embodiment.

In the operation timing chart of FIG. 4, at the instant in time at which the clock signal $\phi_1$ is transitioned from a high voltage to a low voltage, the sampling switches 2a and 2b are turned off. Thus, the electric charge of $(C+\Delta C)*V_{CM1}$ and the electric charge of $(C-\Delta C)*V_{CM1}$, which have been charged on the operational amplifier-side electrodes of the detection MEMS capacitive elements 1a and 1b, respectively, are fixed on these electrodes. At the instant in time above, the forward charging switches 7a, 8a, 7b, and 8b are also turned off. Thus, the electric charge of $-C'^*V_{CAR}$, which has been charged on the operational amplifier input-side electrodes of the feedback capacitive elements 4a and 4b, is also fixed.

Similarly to the operation timing in FIG. 2, also at the operation timing in FIG. 4, after the transition of the clock signal $\phi_1$ to a low voltage, the clock signal $\phi_2$ is transitioned to a high voltage. Thus, the operational amplifiers 3a and 3b are turned to a closed loop state. Therefore, because of the virtual ground operation of the operational amplifiers in the closed loop state, the potentials of the inverting input terminals of the operational amplifiers 3a and 3b, i.e., the potentials of the operational amplifier-side electrodes of the detection MEMS capacitive elements 1a and 1b are at $V_{CM2}$.

On the other hand, as in the operation timing chart of FIG. 4, since the carrier clock $\phi_{COM}$ is transitioned to a high voltage (the voltage value $V_{CAR}$), the potentials of the carrier clock-side electrodes of the detection MEMS capacitive elements 1a and 1b are at $V_{CAR}$. Thus, an electric charge of $(C+\Delta C)*(V_{CM2}-V_{CAR})$ and an electric charge of $(C-\Delta C)*(V_{CM2}-V_{CAR})$ are induced on the operational amplifier-side electrodes of the detection MEMS capacitive elements 1a and 1b, respectively. As a result, an electric charge, which is a difference between the electric charge of $(C+\Delta C)*V_{CM1}$ and the electric charge of $(C-\Delta C)*V_{CM1}$) having been fixed on the operational amplifier-side electrodes of the detection MEMS capacitive elements 1a and 1b, respectively, is transferred from the detection MEMS capacitive elements 1a and 1b to the operational amplifier input-side electrodes of the feedback capacitive elements 4a and 4b. The electric charge of $-C'^*V_{CAR}$ has been fixed on both of the operational amplifier input-side electrodes of the feedback capacitive elements 4a and 4b at the instant in time of the transition of the clock signal $\phi_1$ to a low voltage. Thus, eventually, the electric charge $Q_{FP}$ of the operational amplifier input-side electrode of the feedback capacitive element 4a is $$Q_{FP} = -C'^*V_{CAR} + \{(C+\Delta C)*V_{CM1} - (C+\Delta C)*(V_{CM2}-V_{CAR})\} = \Delta C^*(V_{CAR}+V_{CM1}-V_{CM2}) + (C-C') *V_{CAR} - C(V_{CM2}-V_{CM1}).$$

The electric charge $Q_{FN}$ of the operational amplifier input-side electrode of the feedback capacitive element 4b is $$Q_{FN} = -C'^*V_{CAR} + \{(C-\Delta C)*V_{CM1} - (C-\Delta C)*(V_{CM2}-V_{CAR})\} = -\Delta C^*(V_{CAR}+V_{CM1}-V_{CM2}) + (C-C') *V_{CAR} - C(V_{CM2}-V_{CM1}).$$

Therefore, the outputs $V_{OUTP}$ and $V_{OUTN}$ of the operational amplifiers 3a and 3b are expressed as below from $V_{OUTP}=V_{CM2}-Q_{FP}/C_F$, and $V_{OUTN}=V_{CM2}-Q_{FN}/C_F$.

$$V_{OUTP} = V_{CM2} - V_{CAR} \cdot \frac{C-C'}{C_F} + \qquad \text{[Equation 15]}$$
$$(V_{CM2} - V_{CM1}) \cdot \frac{C}{C_F} + (V_{CAR} + V_{CM1} - V_{CM2}) \cdot \frac{\Delta C}{C_F}$$

$$V_{OUTN} = V_{CM2} - V_{CAR} \cdot \frac{C-C'}{C_F} + \qquad \text{[Equation 16]}$$
$$(V_{CM2} - V_{CM1}) \cdot \frac{C}{C_F} + (V_{CAR} + V_{CM1} - V_{CM2}) \cdot \frac{\Delta C}{C_F}$$

These are equations corresponding to Equations 9 and 10 in the first embodiment. By modifying these equations, in the case of $V_{CM1}=V_{CM2}=V_{DD}/2$, the differential output and the output in-phase voltage level of the CV conversion amplifier are as below.

$$V_{OUT} = -2V_{CAR} \cdot \frac{\Delta C}{C_F} \qquad \text{[Equation 17]}$$

$$V_{CMO} = \frac{V_{DD}}{2} - V_{CAR} \cdot \frac{C-C'}{C_F} \qquad \text{[Equation 18]}$$

Similarly to the first embodiment, with the selection of C'=C, the second right-hand term in Equation 18 can be zero. A sufficiently wide amplitude range of the output voltage of the CV conversion amplifier can be secured.

Third Embodiment

Figure 5:
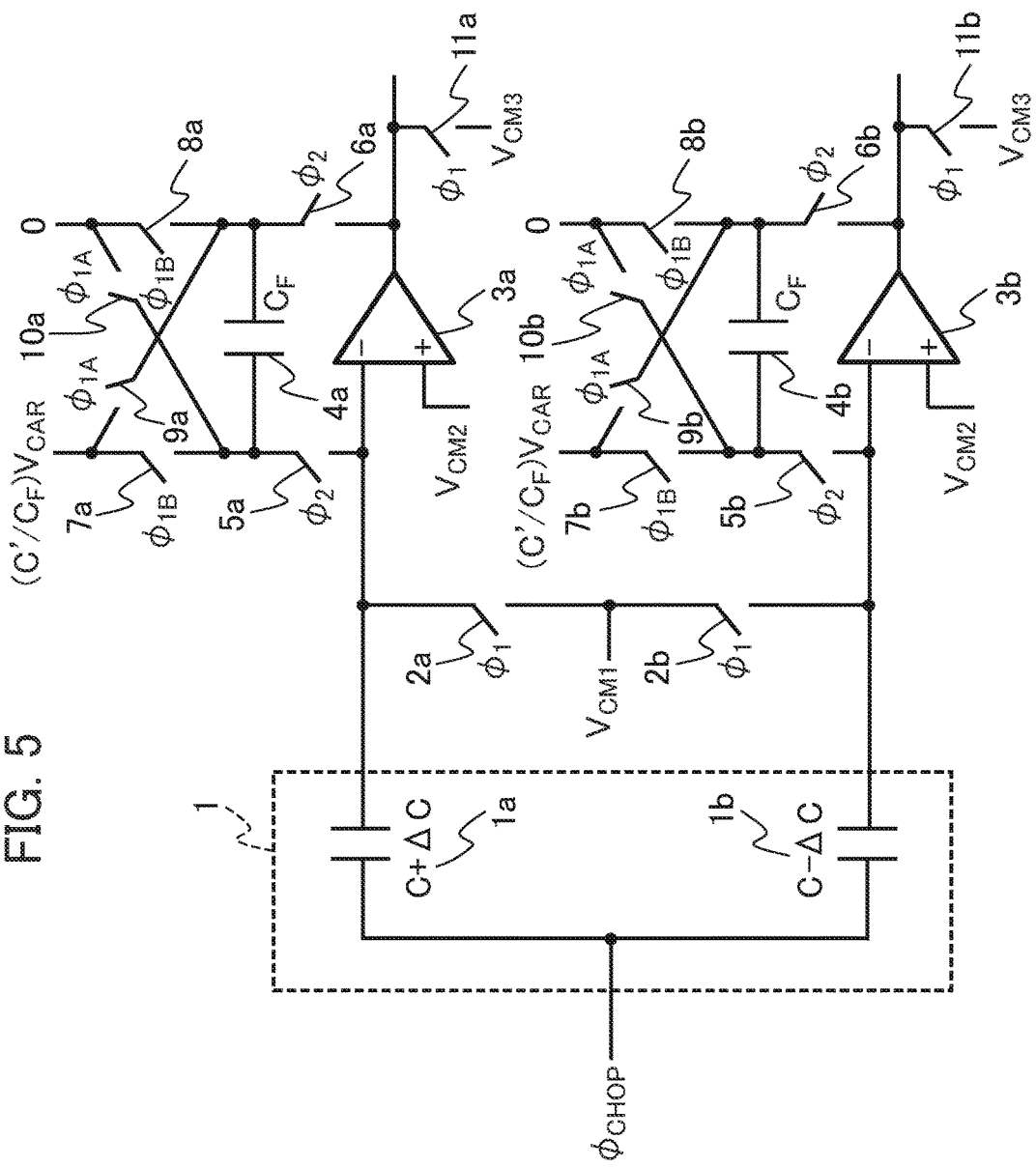
FIG. 5 is a circuit diagram of a third embodiment of the present invention.
Figure 6:
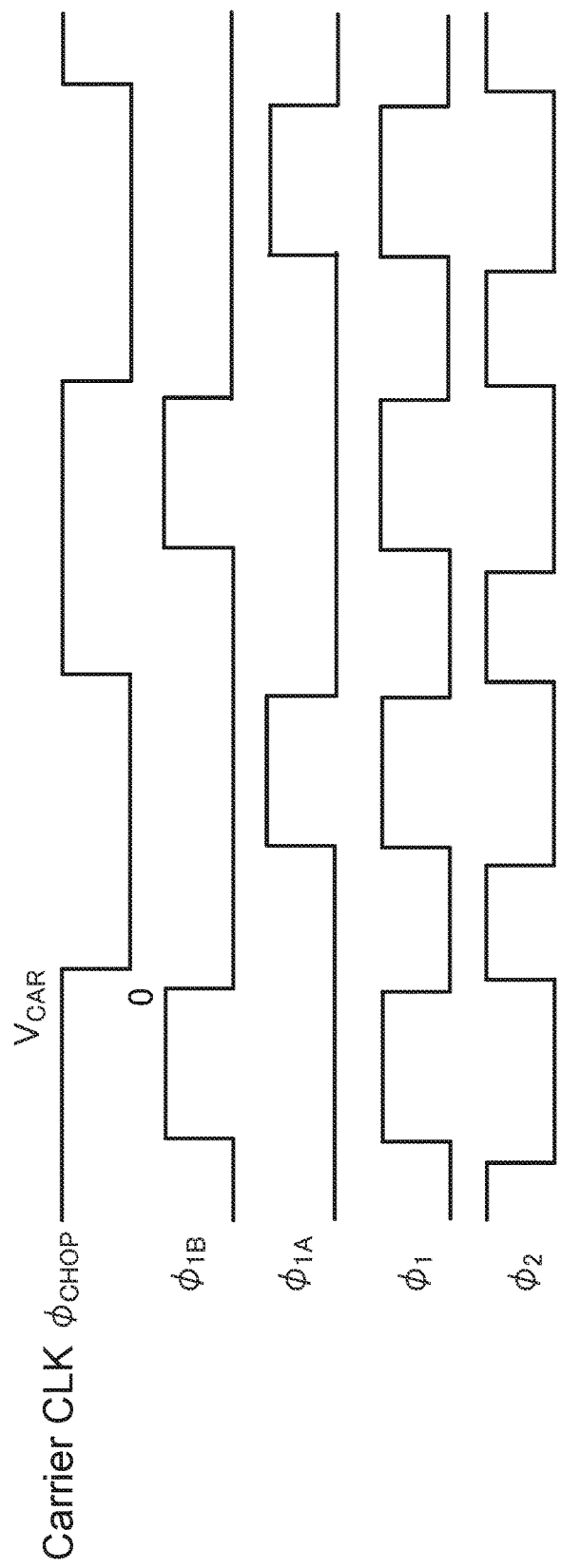
FIG. 6 is an operation timing chart of the third embodiment of the present invention.

FIG. 5 shows a third embodiment of the present invention. FIG. 6 shows an operation timing chart of the third embodiment. It is an object of the embodiment that a CV conversion amplifier is provided with an amplitude modulation function to convert a low-frequency signal ΔC into a radio-frequency signal for avoiding the influence of 1/f noise and the direct current offset voltage of the CV conversion amplifier and subsequent analog circuits. In other words, the object is to operate the CV conversion amplifier as a so-called chopper amplifier. This function corresponds to alternately performing the operation of the first embodiment and the operation of the second embodiment.

In order to achieve this, the difference from the first embodiment is in that first, as illustrated in FIG. 6, the frequency of a carrier clock $\phi_{CHOP}$ is a half of the frequency of the clock signal $\phi_1$ or $\phi_2$. Thus, in the relationship between the carrier clock $\phi_{CHOP}$ and the clock signal $\phi_1$, their levels are alternately changed. In other words, when the carrier clock $\phi_{CHOP}$ is at a high voltage in a certain period in which the clock signal $\phi_1$ is at a high voltage, in the subsequent period in which the clock signal $\phi_1$ is at a high voltage, the carrier clock $\phi_{CHOP}$ is at a low voltage. In other words, the relationship the same as the relationship in the case of the first embodiment and the relationship the same as the relationship in the case of the second embodiment alternately occur. Thus, this allows amplitude modulation to be implemented. However, correspondingly to the relationship of the levels alternately changed, also in the method for compensating a shift of the center voltage level of the output of the operational amplifier, compensation in the first embodiment and compensation in the second embodiment have to be alternately performed.

In order to achieve this, as illustrated in FIG. 5, reverse charging switches 9a, 9b, 10a and 10b are additionally provided, and compensation in the first embodiment is performed by charging feedback capacitive elements using forward charging switches 7a, 7b, 8a, and 8b. Compensation in the second embodiment is performed by charging the feedback capacitive elements in the reverse direction using the reverse charging switches 9a, 9b, 10a and 10. In order to achieve this, a clock signal $\phi_{1B}$ that controls the turning on and off of the forward charging switches 7a, 7b, 8a, and 8b and a clock signal $\phi_{1A}$ that controls the turning on and off of the reverse charging switches 9a, 9b, 10a and 10b are additionally provided as illustrated in FIG. 6.

Referring to FIG. 5, configurations will be described. Configurations similar to the configurations of FIG. 1 are designated the same reference numerals and signs, and the description is omitted. In the embodiment, in addition to the configurations of the first embodiment, the operational amplifier input-side electrode of a feedback capacitive element 4a is connected to the ground (at zero potential) through the reverse charging switch 10a, and the operational amplifier output-side electrode is connected to the charging voltage through the reverse charging switch 9a. Similarly, the operational amplifier input-side electrode of a feedback capacitive element 4b is connected to the ground (at zero potential) through the reverse charging switch 10b, and the operational amplifier output-side electrode is connected to the charging voltage through the reverse charging switch 9b. The turning on and off the reverse charging switches 9a, 9b, 10a and 10b is controlled by the clock signal $\phi_{1A}$.

Referring to FIG. 6, the operation will be described. In the operation timing chart in FIG. 6, in a period in which the carrier clock $\phi_{CHOP}$ is at a high voltage (a voltage value $V_{CAR}$) and the clock signal $\phi_1$ is at a high voltage, sampling switches 2a and 2b are turned on, an electric charge of $-(C+\Delta C)*(V_{CAR}-V_{CM1})$ is charged on the operational amplifier-side electrode of a detection MEMS capacitive element 1a, and an electric charge of $-(C-\Delta C)*(V_{CAR}-V_{CM1})$ is charged on the operational amplifier-side electrode of a detection MEMS capacitive element 1b.

At this time, the clock signal $\phi_{1B}$ is at a high voltage. Thus, the forward charging switches 7a and 8a are turned on. Hence, the operational amplifier input-side electrode of the feedback capacitive element 4a is connected to the charging voltage, and the operational amplifier output-side electrode is connected to the ground (at zero potential). At this time, since the clock signal $\phi_2$ is at a low voltage, an input-side feedback switch 5a and an output-side feedback switch 6a are turned off, and an operational amplifier 3a is in an open loop state. Similarly, the forward charging switches 7b and 8b are turned on by the clock signal $\phi_{1B}$. Thus, the operational amplifier input-side electrode of the feedback capacitive element 4b is connected to the charging voltage, and the operational amplifier output-side electrode is connected to the ground (at zero potential). At this time, since the clock signal $\phi_2$ is at a low voltage, an input-side feedback switch 5b and an output-side feedback switch 6b are turned off, and an operational amplifier 3b is in an open loop state.

Therefore, when the charging voltage is $(C'/C_F)V_{CAR}$, an electric charge of $C'*V_{CAR}$ is charged on both of the operational amplifier input-side electrodes of the feedback capacitive elements 4a and 4b. The voltages of the inverting input terminals of the operational amplifiers 3a and 3b are at $V_{CM1}$, the voltages of the non-inverting input terminals are at $V_{CM2}$, and the operational amplifiers are in the open loop state. Thus, the output voltages of the operational amplifiers 3a and 3b are to swing to a voltage which a voltage difference ($V_{CM2}-V_{CM1}$) is multiplied by the open loop gain of the operational amplifiers 3a and 3b. Consequently, as described in the first embodiment, the outputs of the operational amplifiers 3a and 3b are also to swing to a relatively large voltage value. Also in this case, the present invention effectively functions. In the embodiment, the output reset switches 11a and 11b, which are connected to the outputs of the operational amplifiers 3a and 3b, are turned on. Thus, the outputs of the operational amplifiers 3a and 3b are both connected to the voltage $V_{CM3}$, and the output voltage values are fixed to $V_{CM3}$. Note that, $V_{CM3}$ only has to be set to a suitable voltage value by a method similar to the method in the first embodiment.

In FIG. 6, at the instant in time at which the clock signal $\phi_1$ is transitioned from a high voltage to a low voltage, the sampling switches 2a and 2b are turned off. Thus, the electric charge of $-(C+\Delta C)*(V_{CAR}-V_{CM1})$ and the electric charge of $-(C-\Delta C)*(V_{CAR}-V_{CM1})$, which have been charged on the operational amplifier-side electrodes of the detection MEMS capacitive elements 1a and 1b, respectively, are fixed on these electrodes. At the instant in time above, the clock signal $\phi_{1B}$ is also transitioned to a low voltage. Thus, the forward charging switches 7a, 8a, 7b, and 8b are also turned off, and the electric charge of $C'*V_{CAR}$, which has been charged on the operational amplifier input-side electrodes of the feedback capacitive elements 4a and 4b, is also fixed.

As illustrated in FIG. 6, after the transition of the clock signals $\phi_1$ and $\phi_{1B}$ to a low voltage, the clock signal $\phi_2$ is transitioned to a high voltage. Thus, the operational amplifier 3a is turned to a closed loop state. Similarly, the operational amplifier 3b is turned to a closed loop state. Therefore, because of the virtual ground operation of the operational amplifiers in the closed loop state, the potentials of the inverting input terminals of the operational amplifiers 3a and 3b, i.e., the potentials of the operational amplifier-side electrodes of the detection MEMS capacitive elements 1a and 1b are at $V_{CM2}$.

On the other hand, as illustrated in FIG. 6, the carrier clock $\phi_{CHOP}$ is transitioned to a low voltage (zero potential). Thus, the potentials of the carrier clock-side electrodes of the detection MEMS capacitive elements 1a and 1b are zero. Hence, an electric charge of $(C+\Delta C)*V_{CM2}$ and an electric charge of $(C-\Delta C)*V_{CM2}$ are induced on the operational amplifier-side electrodes of the detection MEMS capacitive elements 1a and 1b, respectively. As a result, an electric charge, which is a difference between the electric charge of $-(C+\Delta C)*(V_{CAR}-V_{CM1})$ and the electric charge of $-(C-\Delta C)*(V_{CAR}-V_{CM1})$ having been fixed on the operational amplifier-side electrodes of the detection MEMS capacitive elements 1a and 1b, respectively, is transferred from the operational amplifier input-side electrodes of the feedback capacitive elements 4a and 4b to the detection MEMS capacitive elements 1a and 1b. The electric charge of $C'*V_{CAR}$ has been fixed on both of the operational amplifier input-side electrodes of the feedback capacitive elements 4a and 4b at the instant in time of the transition of the clock signal $\phi_{1B}$ to a low voltage. Thus, eventually, the electric charge $Q_{FP}$ of the operational amplifier input-side electrode of the feedback capacitive element 4a is $$Q_{FP}=C'*V_{CAR}-[(C\Delta C)*V_{CM2}-\{-(C+\Delta C)*(V_{CAR}-V_{CM1})\}]=-\Delta C*(V_{CAR}-V_{CM1}+V_{CM2})-(C-C')*V_{CAR}-C(V_{CM2}-V_{CM1}).$$

The electric charge $Q_{FN}$ of the operational amplifier input-side electrode of the feedback capacitive element 4b is $$Q_{FN}=C*V_{CAR}[(C-\Delta C)*V_{CM2}-\{-(C-\Delta C)*(V_{CAR}-V_{CM1})\}]=\Delta C*(V_{CAR}-V_{CM1}+V_{CM2})-(C-C')*V_{CAR}-C(V_{CM2}-V_{CM1}).$$

Therefore, the outputs $V_{OUTP}$ and $V_{OUTN}$ of the operational amplifiers 3a and 3b are the same as the outputs in Equations 9 and 10 in the first embodiment from $V_{OUTP}=V_{CM2}-Q_{FP}/C_F$ and $V_{OUTN}=V_{CM2}-Q_{FN}/C_F$. Thus, the differential output and the output in-phase voltage level of the CV conversion amplifier are obtained similar to ones in Equations 13 and 14 in the first embodiment.

On the other hand, as illustrated in FIG. 6, in a period in which the subsequent clock signal $\phi_1$ is at a high voltage, the carrier clock $\phi_{COM}$ is now at a low voltage (at zero potential). Since the clock signal $\phi_1$ is at a high voltage, the sampling switches 2a and 2b are turned on, an electric charge of $(C+\Delta C)*V_{CM1}$ is charged on the operational amplifier-side electrode of the detection MEMS capacitive element 1a, and an electric charge of $(C-\Delta C)*V_{CM1}$ is charged on the operational amplifier-side electrode of the detection MEMS capacitive element 1b.

At this time, the clock signal $\phi_{1A}$ is at a high voltage. Thus, the reverse charging switches 10a and 9a are turned on. Hence, the operational amplifier input-side electrode of the feedback capacitive element 4a is connected to the ground (at zero potential), and the operational amplifier output-side electrode is connected to the charging voltage. At this time, since the clock signal $\phi_2$ is at a low voltage, the input-side feedback switch 5a and the output-side feedback switch 6a are turned off, and the operational amplifier 3a is in the open loop state. Similarly, the reverse charging switches 10b and 9b are turned on by the clock signal $\phi_{1A}$. Thus, the operational amplifier input-side electrode of the feedback capacitive element 4b is connected to the ground (at zero potential), and the operational amplifier output-side electrode is connected to the charging voltage. At this time, since the clock signal $\phi_2$ is at a low voltage, the input-side feedback switch 5b and the output-side feedback switch 6b are turned off, and the operational amplifier 3b is in the open loop state. Consequently, an electric charge of $-C'*V_{CAR}$ is charged on both of the operational amplifier input-side electrodes of the feedback capacitive elements 4a and 4b.

In FIG. 6, at the instant in time at which the clock signal $\phi_1$ is transitioned from a high voltage to a low voltage, the sampling switches 2a and 2b are turned off. Thus, the electric charge of $(C+\Delta C)*V_{CM1}$ and the electric charge of $(C-\Delta C)*V_{CM1}$, which have been charged on the operational amplifier-side electrodes of the detection MEMS capacitive elements 1a and 1b, respectively, are fixed on these electrodes. At the instant in time above, the clock signal $\phi_{1A}$ is also transitioned to a low voltage. Thus, the reverse charging switches 10a, 9a, 10b, and 9b are also turned off. Consequently, the electric charge of $-C'*V_{CAR}$, which has been charged on the operational amplifier input-side electrodes of the feedback capacitive elements 4a and 4b, is also fixed.

As illustrated in FIG. 6, after the transition of the clock signals $\phi_1$ and $\phi_{1A}$ to a low voltage, the clock signal $\phi_2$ is transitioned to a high voltage. Thus, the input-side feedback switch 5a and the output-side feedback switch 6a are turned on, and the feedback capacitive element 4a is inserted between the input and the output of the operational amplifier 3a. Consequently, the operational amplifier 3a is turned to a closed loop state. Similarly, the input-side feedback switch 5b and the output-side feedback switch 6b are turned on, and the feedback capacitive element 4b is inserted between the input and the output of the operational amplifier 3b. Consequently, the operational amplifier 3b is turned to a closed loop state. Therefore, because of the virtual ground operation of the operational amplifiers in the closed loop state, the potentials of the inverting input terminals of the operational amplifiers 3a and 3b, i.e., the potentials of the operational amplifier-side electrodes of the detection MEMS capacitive elements 1a and 1b are at $V_{CM2}$.

On the other hand, as illustrated in FIG. 6, since the carrier clock $\phi_{COM}$ is transitioned to a high voltage (the voltage value $V_{CAR}$), the potentials of the carrier clock-side electrodes of the detection MEMS capacitive elements 1a and 1b are at $V_{CAR}$. Thus, an electric charge of $(C+\Delta C)^*(V_{CM2}-V_{CAR})$ and an electric charge of $(C-\Delta C)^*(V_{CM2}-V_{CAR})$ are induced on the operational amplifier-side electrodes of the detection MEMS capacitive elements 1a and 1b, respectively. As a result, an electric charge, which is a difference between the electric charge of $(C+\Delta C)^*V_{CM1}$ and the electric charge of $(C-\Delta C)^*V_{CM1}$) having been fixed on the operational amplifier-side electrodes of the detection MEMS capacitive elements 1a and 1b, respectively, is transferred from the detection MEMS capacitive elements 1a and 1b to the operational amplifier input-side electrodes of the feedback capacitive elements 4a and 4b. The electric charge of $-C'*V_{CAR}$ has been fixed on both of the operational amplifier input-side electrodes of the feedback capacitive elements 4a and 4b at the instant of the transition of the clock signal $\phi_{1A}$ to a low voltage. Thus, eventually, the electric charge $Q_{FP}$ of the operational amplifier input-side electrode of the feedback capacitive element 4a is $$Q_{FP}=-C'^*V_{CAR}+\{(C+\Delta C)^*V_{CM1}-(C+\Delta C)^*(V_{CM2}-V_{CAR})\}=\Delta C^*(V_{CAR}+V_{CM1}-V_{CM2})+(C-C')*V_{CAR}-C(V_{CM2}-V_{CM1}).$$

The electric charge $Q_{FN}$ of the operational amplifier input-side electrode of the feedback capacitive element 4b is $$Q_{FN}=-C'^*V_{CAR}+\{(C-\Delta C)^*V_{CM1}-(C-\Delta C)^*(V_{CM2}-V_{CAR})\}=-\Delta C^*(V_{CAR}+V_{CM1}-V_{CM2})+(C-C')*V_{CAR}-C(V_{CM2}-V_{CM1}).$$

Therefore, the outputs $V_{OUTP}$ and $V_{OUTN}$ of the operational amplifiers 3a and 3b are the same as the outputs in Equations 15 and 16 in the second embodiment from $V_{OUTP}=V_{CM2}-Q_{FP}/C_F$ and $V_{OUTN}=V_{CM2}-Q_{FN}/C_F$. Thus, the differential output and the output in-phase voltage level of the CV conversion amplifier similar to those in Equations 17 and 18 in the second embodiment can be obtained.

From the description above, it is revealed that in the embodiment, the signs of the capacitance-to-voltage conversion gain are alternately changed. This is equivalent to the amplitude modulation of the signal $\Delta C$ by the carrier clock $\phi_{CHOP}$. As a result, the low-frequency signal $\Delta C$ is converted into a radio-frequency signal, allowing the avoidance of the influence of 1/f noise and the direct current offset voltage of the CV conversion amplifier and subsequent analog circuits. In other words, the CV conversion amplifier is operated as a so-called chopper amplifier. Similarly to the first and the second embodiments, also in the third embodiment, with the selection of C'=C, a sufficiently wide amplitude range of the output voltage of the CV conversion amplifier can be secured.

Fourth Embodiment

Figure 7:
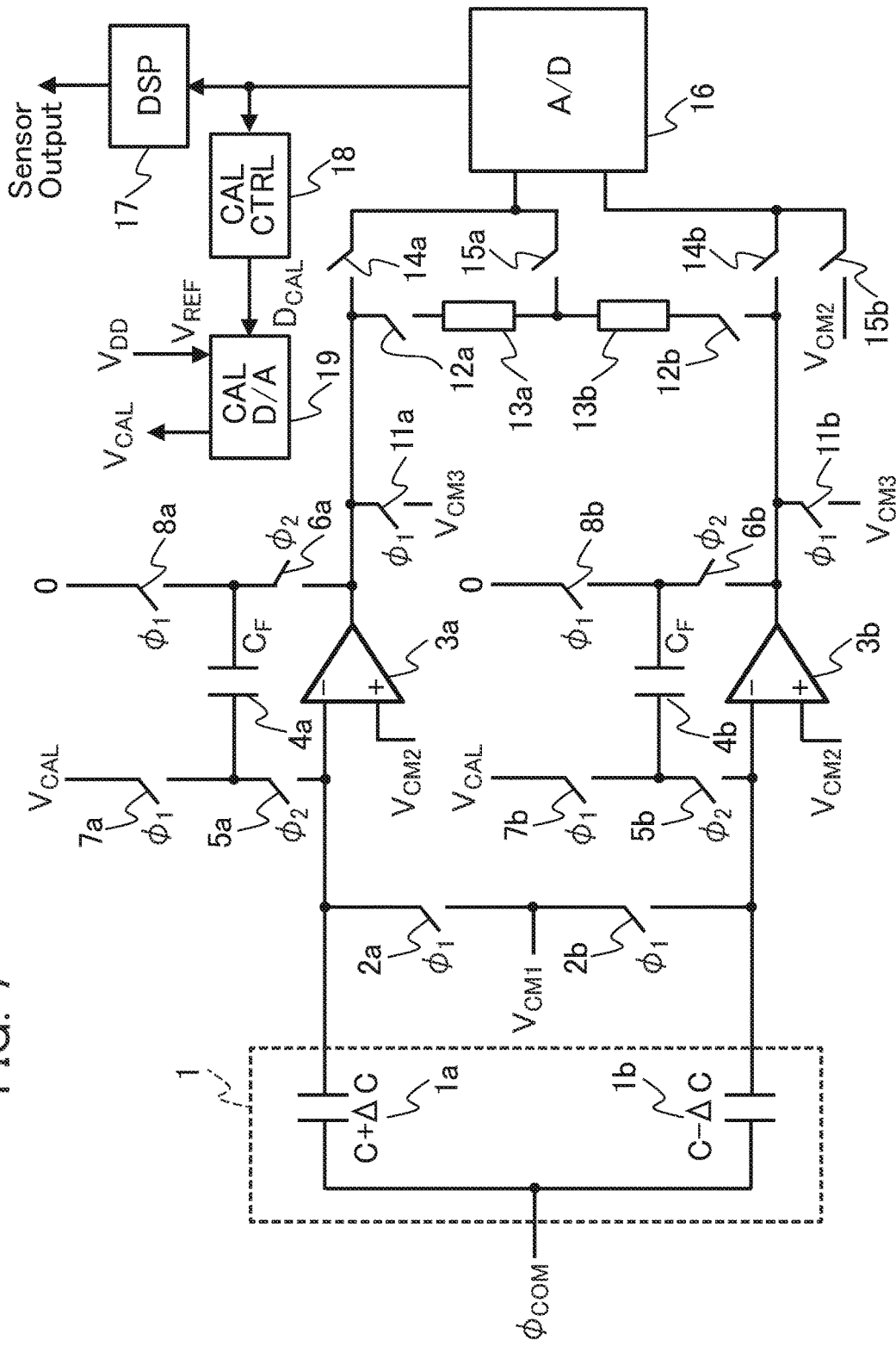
FIG. 7 is a circuit diagram of a fourth embodiment of the present invention.

FIG. 7 shows a fourth embodiment of the present invention. In the embodiment, a CV conversion amplifier has configurations, operations, and effects the same as ones in the first embodiment, and the description related to the CV conversion amplifier is omitted. Of course, the CV conversion amplifiers described in the embodiments other than the first embodiment are also applicable to the fourth embodiment. The embodiment discloses the overall structure of an MEMS capacitive sensor including the CV conversion amplifier, and also describes a method for supplying a charging voltage.

First, the configuration will be described. The outputs of the operational amplifiers 3a and 3b of the CV conversion amplifier are connected to the differential input terminal of an A/D converter 16 through differential voltage detection switches 14a and 14b. Between the outputs of the operational amplifiers 3a and 3b, in-phase voltage detection resisters 13a and 13b are inserted in series through in-phase voltage generation switches 12a and 12b. Anode connecting the in-phase voltage detection resisters 13a and 13b to each other is connected to the positive-phase input terminal of the A/D converter 16 through an in-phase voltage detection switch 15a. The negative-phase input terminal of the A/D converter 16 is connected to the voltage $V_{CM2}$ through an in-phase voltage detection switch 15b.

The output of the A/D converter 16 is inputted to a digital signal processor 17, and the output of the digital signal processor 17 is the output of the sensor. The output of the A/D converter 16 is also inputted to an in-phase compensation controller 18. An output $D_{CAL}$ of the in-phase compensation controller 18 is inputted to an in-phase compensation D/A converter 19. An output $V_{CAL}$ of the in-phase compensation D/A converter 19 is connected to forward charging switches 7a and 7b as a charging voltage.

Next, the operation will be described. First, the operation in a period in which the charging voltage $V_{CAL}$ is determined will be described. During the period, the CV conversion amplifier operates as described in the other embodiments. During the period, the in-phase voltage generation switches 12a and 12b are on. Thus, the average voltage of the positive-phase side output voltage (the output voltage of the operational amplifier 3a) and the negative-phase side output voltage (the output voltage of the operational amplifier 3b) of the CV conversion amplifier, i.e., the output in-phase voltage level $V_{CMO}$ (=the center voltage level of the outputs of the operational amplifiers 3a and 3b) of the CV conversion amplifier is generated at the connection node of the in-phase voltage detection resisters 13a and 13b.

During the period, the in-phase voltage detection switches 15a and 15b are turned on. The output in-phase voltage level $V_{CMO}$ of the CV conversion amplifier generated at the connection node is inputted to the positive-phase input terminal of the A/D converter 16, and the voltage $V_{CM2}$ is inputted to the negative-phase input terminal of the A/D converter 16.

Note that, since the differential voltage detection switches 14a and 14b are off during the period, the outputs of the operational amplifiers 3a and 3b of the CV conversion amplifier are not inputted to the A/D converter 16. The A/D converter 16 converts the difference voltage between the voltage of the positive-phase input terminal and the voltage of the negative-phase input terminal, i.e., the difference between the output in-phase voltage level $V_{CMO}$ of the CV conversion amplifier and the voltage $V_{CM2}$, i.e., $V_{CMO}-V_{DD}/2$ into a digital value. Here, $V_{CM2}$ is set to $V_{DD}/2$. However, of course, any voltage values are possible.

The digital value is supplied to the in-phase compensation controller 18. In the case where the digital value is a positive value, this means that the present output in-phase voltage level $V_{CMO}$ of the CV conversion amplifier is higher than $V_{DD}/2$. In this case, the in-phase compensation controller 18 updates the digital compensation value $D_{CAL}$ presently being outputted to a larger value, and outputs the value. On the other hand, in the case where the digital value is a negative value, this means that the present output in-phase voltage level $V_{CMO}$ of the CV conversion amplifier is lower than $V_{DD}/2$. In this case, the in-phase compensation controller 18 updates the digital compensation value $D_{CAL}$ presently being outputted to a smaller value, and outputs the value.

The in-phase compensation D/A converter 19 converts the digital compensation value $D_{CAL}$ supplied from the in-phase compensation controller 18 into the analog voltage $V_{CAL}$, and supplies it as a charging voltage to the CV conversion amplifier. In the case where the present output in-phase voltage level $V_{CMO}$ of the CV conversion amplifier is higher than $V_{DD}/2$, $D_{CAL}$ is increased, and hence the charging voltage $V_{CAL}$ is increased as well. This corresponds to an increase in C', causing a decrease in the output in-phase voltage level $V_{CMO}$ of the CV conversion amplifier below the present level.

On the other hand, in the case where the present output in-phase voltage level $V_{CMO}$ of the CV conversion amplifier is lower than $V_{DD}/2$, $D_{CAL}$ is decreased, and hence the charging voltage $V_{CAL}$ is decreased as well. This corresponds to a decrease in C', causing an increase in the output in-phase voltage level $V_{CMO}$ of the CV conversion amplifier above the present level. By negative feedback control described above, the charging voltage $V_{CAL}$ is finally converged on a suitable voltage value $V_{CAL\_FINAL}$, and the output in-phase voltage level $V_{CMO}$ of the CV conversion amplifier sufficiently close to $V_{DD}/2$.

Next, the operation in a normal operation period will be described. During the normal operation period, the CV conversion amplifier adopts a suitable voltage value $V_{CAL\_FINAL}$ as a charging voltage. The CV conversion amplifier operates as described in the other embodiments. The CV conversion amplifier converts a change $\Delta C$ in the MEMS capacitance generated by a signal, such as an acceleration signal, applied to the sensor into the voltage signal $\Delta V$. The voltage signal $\Delta V$ is at the output differential voltage of the CV conversion amplifier. By adopting the voltage value $V_{CAL\_FINAL}$, the output in-phase voltage level of the CV conversion amplifier is set to near $V_{DD}/2$. Thus, the CV conversion amplifier can normally convert a sufficiently large input signal to the sensor into a voltage signal.

During the normal operation period, the differential voltage detection switches 14a and 14b are in the ON-state. The output of the operational amplifier 3a of the CV conversion amplifier is connected to the positive-phase input terminal of the A/D converter 16, and the output of the operational amplifier 3b is connected to the negative-phase input terminal of the A/D converter 16. Thus, the output differential voltage of the CV conversion amplifier is converted into a digital value by the A/D converter 16. This digital value is inputted to the digital signal processor 17. The digital value is appropriately subjected to necessary digital signal processing, such as demodulation and filtering, at the digital signal processor 17, and then outputted as the output of the sensor.

For the in-phase compensation D/A converter 19, for example, a resister string D/A converter can be used in which a plurality of resisters is connected in series and the voltages of the resisters are divided by a plurality of switches. Of course, various types of D/A converters are applicable to the embodiment other than the resister string DAC.

To the MEMS capacitive sensor according to the embodiment, a CV conversion amplifier is applicable, which can secure the capacitance-to-voltage conversion gain and the amplitude range of the output voltage with a small increase in a consumption current. Thus, a sensor with low power, low noise, and a wide tolerance of input signals can be implemented.

Fifth Embodiment

Figure 8:
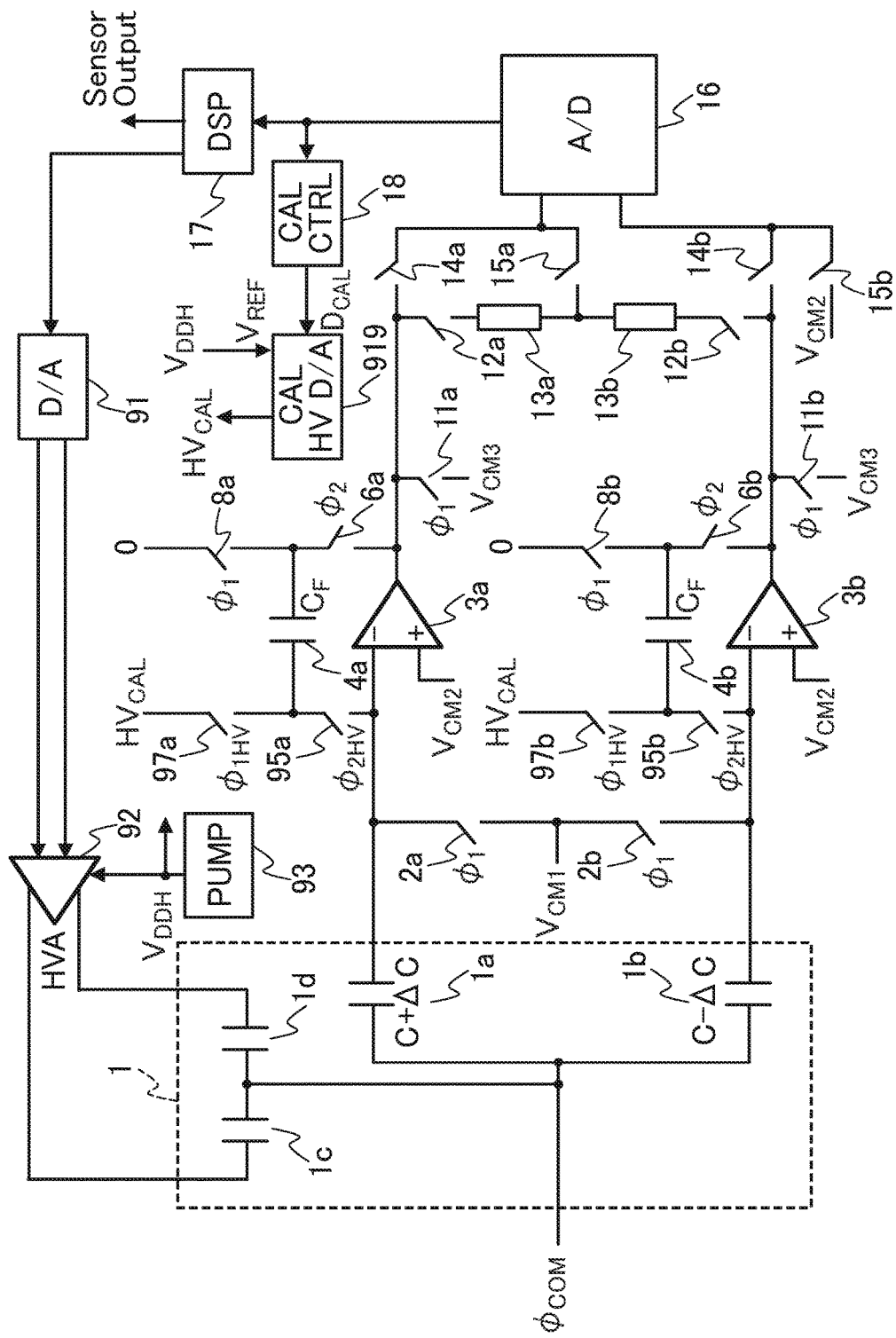
FIG. 8 is a circuit diagram of a fifth embodiment of the present invention.

FIG. 8 shows a fifth embodiment of the present invention. Points different from the fourth embodiment are in that driving MEMS capacitive elements are further included, a high-voltage output amplifier that outputs high-voltage signals to the driving MEMS capacitive elements is included, a D/A converter that supplies an input analog voltage to the high-voltage output amplifier is included, and a booster circuit that supplies a high step-up voltage as the power supply voltage of the high voltage output amplifier. Moreover, the high step-up voltage outputted from the booster circuit is also supplied to an in-phase compensation high voltage output D/A converter, and adapted as a reference voltage $V_{REF}$ of the in-phase compensation high voltage output D/A converter. Thus, the in-phase compensation high voltage output D/A converter can supply a high charging voltage to the CV conversion amplifier. As a result, the capacitance-to-voltage conversion gain of the CV conversion amplifier can be further improved.

First, the configuration will be described. A capacitive MEMS 1 includes two detection MEMS capacitive elements 1a and 1b as well as two driving MEMS capacitive elements 1c and 1d. The movable electrodes of the driving MEMS capacitive elements 1c and 1d are both connected to the movable electrodes of the detection MEMS capacitive elements 1a and 1b. The capacitive MEMS 1 also includes the CV conversion amplifier described in the first embodiment.

An output $D_{CAL}$ of an in-phase compensation controller 18 is inputted to an in-phase compensation high voltage output D/A converter 919 unlike the fourth embodiment. An output $HV_{CAL}$, of the in-phase compensation high voltage output D/A converter 919 is connected as a charging voltage to forward charging high withstand voltage switches 97a and 97b of the CV conversion amplifier. The second output of a digital signal processor 17 is inputted to a D/A converter 91. The outputs of the D/A converter 91 are inputted to a high-voltage output amplifier 92. The differential output of the high-voltage output amplifier 92 is connected to the fixed electrodes of the driving MEMS capacitive elements 1c and 1d. A booster circuit 93 is included. An output voltage $V_{DDH}$ of the booster circuit is connected to the power supply voltage terminal of the high-voltage output amplifier 92 and the reference voltage terminal ($V_{REF}$) of the in-phase compensation high voltage output D/A converter 919.

Next, the operation will be described. First, the operation in a period in which the high charging voltage $HV_{CAL}$ is determined will be described. In this period, negative feedback control is performed similarly to the fourth embodiment, and hence a suitable charging voltage value $HV_{CAL\_FINAL}$ is obtained. Thus, the output in-phase voltage level $V_{CMO}$ of the CV conversion amplifier can be set sufficiently close to $V_{DD}/2$. The embodiment is different from the fourth embodiment in that attention is focused on the fact that many MEMS capacitive sensors basically include the booster circuit 93, and the step-up voltage $V_{DDH}$ of the booster circuit 93 is adapted as the reference voltage $V_{REF}$ of the in-phase compensation high voltage output D/A converter 919. Thus, the in-phase compensation high voltage output D/A converter 919 can convert its digital input value $D_{CAL}$ into the corresponding high voltage $HV_{CAL}$. Consequently, the charging voltage of the CV conversion amplifier can be increased. The charging voltage necessary for the CV conversion amplifier is inversely proportional to the capacitance value $C_F$ of the feedback capacitive elements 4a and 4b of the CV conversion amplifier. Thus, the fact that the charging voltage can be increased means that the capacitance value $C_F$ can be made small. The capacitance-to-voltage conversion gain of the CV conversion amplifier is also inversely proportional to the capacitance value $C_F$. Hence, the fact that the capacitance value $C_F$ can be made small means that the capacitance-to-voltage conversion gain can be increased.

Next, the operation in a normal operation period will be described. The difference from the fourth embodiment is in that during the normal operation period, the CV conversion amplifier adopts $HV_{CAL\_FINAL}$ as a charging voltage for a suitable voltage value, not $V_{CAL\_FINAL}$. The other points are similar to the description of the fourth embodiment.

In the fifth embodiment, the digital signal processor 17 outputs the second output appropriately subjected to necessary digital signal processing, such as demodulation, filtering, and integration, to the D/A converter 91. The D/A converter 91 converts the processed second output into a differential analog voltage signal, and outputs the signal to the high-voltage output amplifier 92. The high-voltage output amplifier 92 amplifies the voltage of the signal to a high voltage to form a high-voltage differential output signal, and applies the high-voltage differential output signal to the fixed electrodes of the driving MEMS capacitive elements 1c and 1d. The movable electrodes of the driving MEMS capacitive elements 1c and 1d are both connected to the movable electrodes of the detection MEMS capacitive elements 1a and 1b, and the movable electrodes of these four MEMS capacitive elements are mechanically coupled to one another for integrally moving as a weight. The high-voltage differential output signal is applied to the fixed electrodes of the driving MEMS capacitive elements 1c and 1d, and hence force proportional to the voltage difference between the high-voltage differential output signals can be applied to the weight.

Thus, in MEMS capacitive acceleration sensors that perform servo control, necessary servo force can be applied to the weight. In MEMS capacitive angular velocity sensors, force necessary to vibrate the weight can be applied to the weight. Vibrations generated in the vertical direction of the vibrations of the weight are detected by the interaction (a so-called Coriolis force) between the vibrations of the weight and the angular velocity applied to the sensor, and hence the MEMS capacitive angular velocity sensor is operated.

Note that, in the case of the MEMS capacitive angular velocity sensor, an MEMS element, a CV conversion amplifier, and A/D converters other than ones shown in FIG. 8 are necessary as well. However, these are omitted in FIG. 8. A plurality of the outputs of A/D converters, not shown, is inputted to the digital signal processor 17. Based on the inputs, the digital signal processor 17 subjects the input to necessary digital signal processing, calculates the output of the sensor, and then outputs them.

The booster circuit 93 may be a charge pump circuit, for example. Alternatively, the booster circuit 93 may be a DC-DC converter using an inductor. Of course, the booster circuit 93 may be a booster circuit other than these types of devices. The high-voltage output amplifier 92 performs amplification operation using the output voltage $V_{DDH}$ raised to the high voltage of the booster circuit 93 as a power supply voltage. In order to generate force necessary to generate servo force or vibrate the weight, a high voltage is necessary, and this causes the high-voltage output amplifier 92 to have to output a high voltage. Thus, the power supply voltage for the high-voltage output amplifier 92 has to be sufficiently a high voltage. Because of the requirement, in the MEMS capacitive acceleration sensor that performs servo control, the MEMS capacitive angular velocity sensor, or many other sensors including angle sensors, these sensors often basically include a booster circuit. In the embodiment, the output of the booster circuit is used, focusing attention on this point.

The in-phase compensation high voltage output D/A converter 919 may be a resister string D/A converter, or of course, the in-phase compensation high voltage output D/A converter 919 may be a various types of D/A converters other than the resister string DAC. In the case of the resister string D/A converter, a high voltage is sometimes applied to switches to divide the pressure of resisters. Thus, it is fine that these switches are configured of MOS transistors that withstand high voltages.

The charging voltage $HV_{CAL}$ is possibly a high voltage. Thus, it is fine that the forward charging high withstand voltage switches 97a and 97b of the CV conversion amplifier connected to the charging voltage $HV_{CAL}$ are configured of MOS transistors that withstand high voltages. Moreover, input-side feedback high-withstand voltage switches 95a and 95b are connected to the nodes on the feedback capacitive elements 4a and 4b side, and the voltages of these nodes are possibly high voltages. Because of this, the input-side feedback high-withstand voltage switches 95a and 95b may be configured of MOS transistors that withstand high voltages. In this case, the turning on and off of the forward charging high withstand voltage switches 97a and 97b is controlled by a high-voltage clock signal $\phi_{1HV}$. The turning on and off the input-side feedback high-withstand voltage switches 95a and 95b is controlled by a high-voltage clock signal $\phi_{2HV}$.

Figure 9:
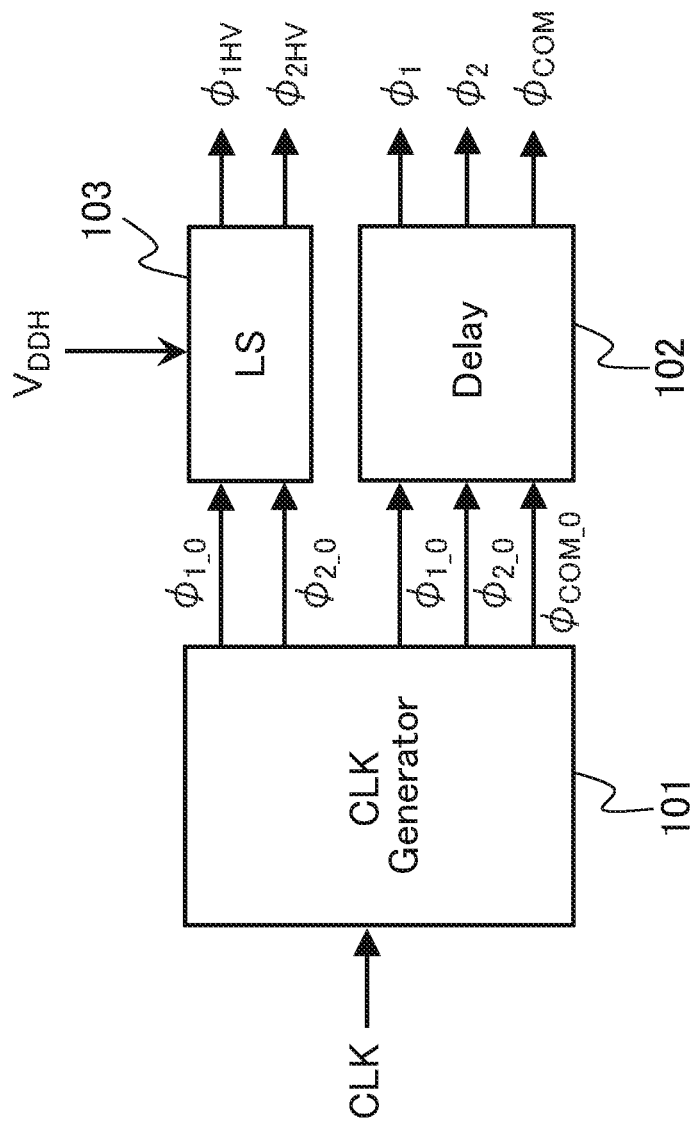
FIG. 9 is a circuit diagram supplementarily explaining the fifth embodiment of the present invention.

FIG. 9 shows a circuit that generates the high-voltage clock signal $\phi_{1HV}$, the high-voltage clock signal $\phi_{2HV}$, and other signals. A system clock CLK is inputted to a clock generator circuit 101. The clock generator circuit 101 generates clock signals $\phi_{1\_0}$, $\phi_{2\_0}$, and $\phi_{COM\_0}$. These signals are generated so that the signals have the same timing relationships as the clock signals $\phi_1$ and $\phi_2$, and the carrier clock $\phi_{COM}$ shown in the operation timing chart in FIG. 2. The clock signals $\phi_{1\_0}$ and $\phi_{2\_0}$ are inputted to a level shifter circuit 103. In the level shifter circuit 103, the clock signal $\phi_{1HV}$ is generated from the clock signal $\phi_{1\_0}$ and the clock signal $\phi_{2HV}$ is generated from the clock signal $\phi_{2\_0}$. The clock signal $\phi_{1HV}$ is a clock signal at the same timing as the clock signal $\phi_1$. However, its high-voltage level is higher than the high-voltage level (=$V_{DD}$) of the clock signal $\phi_1$. The clock signal $\phi_{2HV}$ is a clock signal at the same timing as the clock signal $\phi_2$. However, its high-voltage level is higher than the high-voltage level (=$V_{DD}$) of the clock signal $\phi_2$.

The input-side feedback high-withstand voltage switches 95a and 95b and the forward charging high withstand voltage switches 97a and 97b, whose turning on and off is controlled by the clock signals $\phi_{1HV}$ and $\phi_{2HV}$, are sometimes connected to high voltages. Thus, in order to normally turn on and off these switches, it is necessary to raise the high-voltage levels of the clock signals $\phi_{1HV}$ and $\phi_{2HV}$. For example, the output voltage $V_{DDH}$ of the booster circuit 93 is set to the power supply voltage of the level shifter circuit 103, and a widely known level shifter circuit configuration is adapted. Thus, the clock signals $\phi_{1HV}$ and $\phi_{2HV}$ can be generated so that the high-voltage levels of the clock signals $\phi_{1HV}$ and $\phi_{2HV}$ are equal to the voltage $V_{DDH}$. Of course, it may be possible to adapt high voltages other than the output voltage $V_{DDH}$ of the booster circuit as the power supply voltage of the level shifter circuit 103.

The clock signals $\phi_{1HV}$ and $\phi_{2HV}$ generated in the level shifter circuit 103 have a time delay in association with the operation of the level shifter circuit. As illustrated in FIG. 9, in order to make delays equal, the clock signals $\phi_{1\_0}$ and $\phi_{2\_0}$ and the carrier clock $\phi_{COM\_0}$ may be delayed in time to the same extent as the time delay using a delay circuit 102. To the delay circuit 102, a widely known delay circuit configuration can be adapted, in which the clock signal $\phi_1$ is outputted with the clock signal $\phi_{1\_0}$ being delayed, the clock signal $\phi_2$ is outputted with the clock signal $\phi_{2\_0}$ being delayed, and the carrier clock $\phi_{COM}$ is outputted with the carrier clock $\phi_{COM\_0}$ being delayed. Thus, the timings of the clock signals $\phi_1$ and $\phi_2$, $\phi_{1HV}$, $\phi_{2HV}$ and the carrier clock $\phi_{COM}$ used by the CV conversion amplifier can be matched with one another. The embodiment also exerts effects similar to the effect of the fourth embodiment.

Sixth Embodiment

Figure 10:
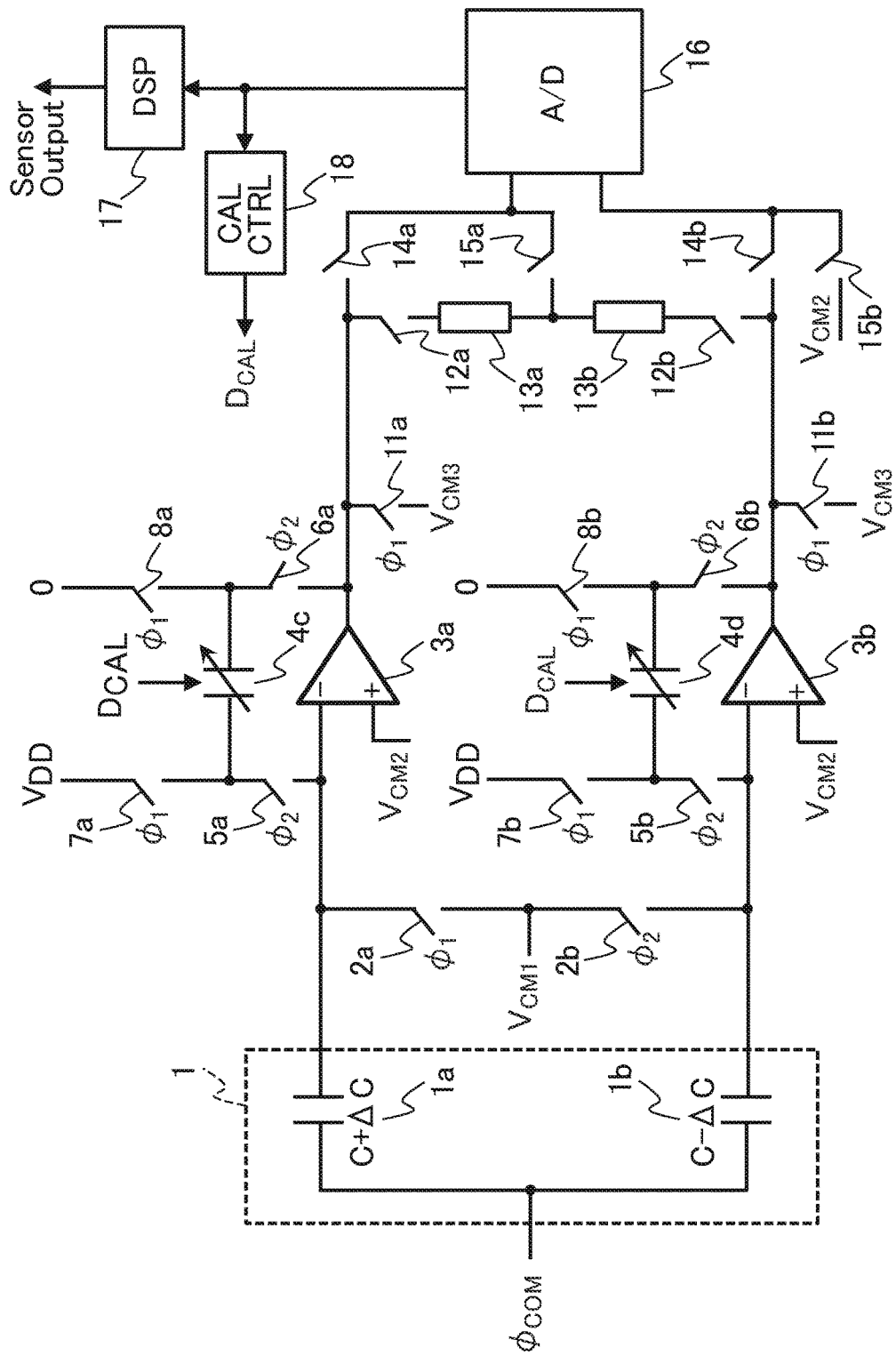
FIG. 10 is a circuit diagram of a sixth embodiment of the present invention.

FIG. 10 shows a sixth embodiment of the present invention. In the embodiment, the in-phase compensation D/A converter 19 in the fourth embodiment is removed. Instead, the capacitance values of the feedback capacitive elements are directly controlled by the digital output $D_{CAL}$ of the in-phase compensation controller 18. Thus, variable feedback capacitances 4c and 4d are used in the CV conversion amplifier. In other words, the amount of an electric charge of the feedback capacitive element necessary to compensate a shift of the center voltage level of the output of the operational amplifier is adjusted by the capacitance values of the feedback capacitive elements, instead of adjusting it by the output voltage of the in-phase compensation D/A converter 19. Thus, a charging voltage can be a fixed voltage. For example, the fixed voltage only has to be the power supply voltage $V_{DD}$, the reference voltage of the A/D converter 16, or the like. Of course, the fixed voltage may be other D/C voltages. For an example of implementing the variable feedback capacitances 4c and 4d, there is the configuration of a so-called binary capacitance array in which a plurality of capacitances is connected in parallel with each other and the capacitances are selectively connected to change capacitance. However, the configuration is not limited to this one specifically. The embodiment also exerts effects similar to the effect of the fourth embodiment.

Seventh Embodiment

Figure 11:
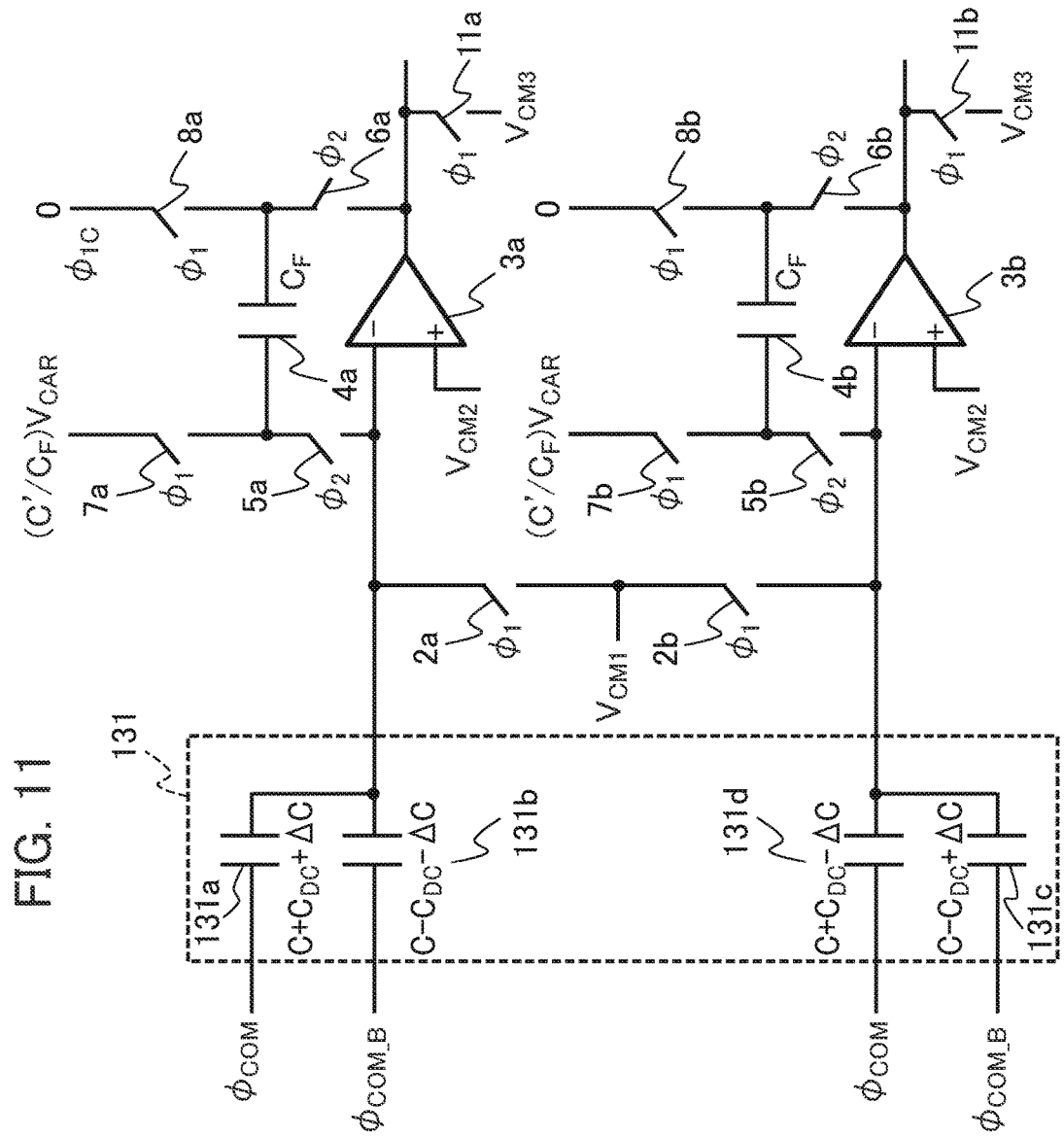
FIG. 11 is a circuit diagram of a seventh embodiment of the present invention.
Figure 12:
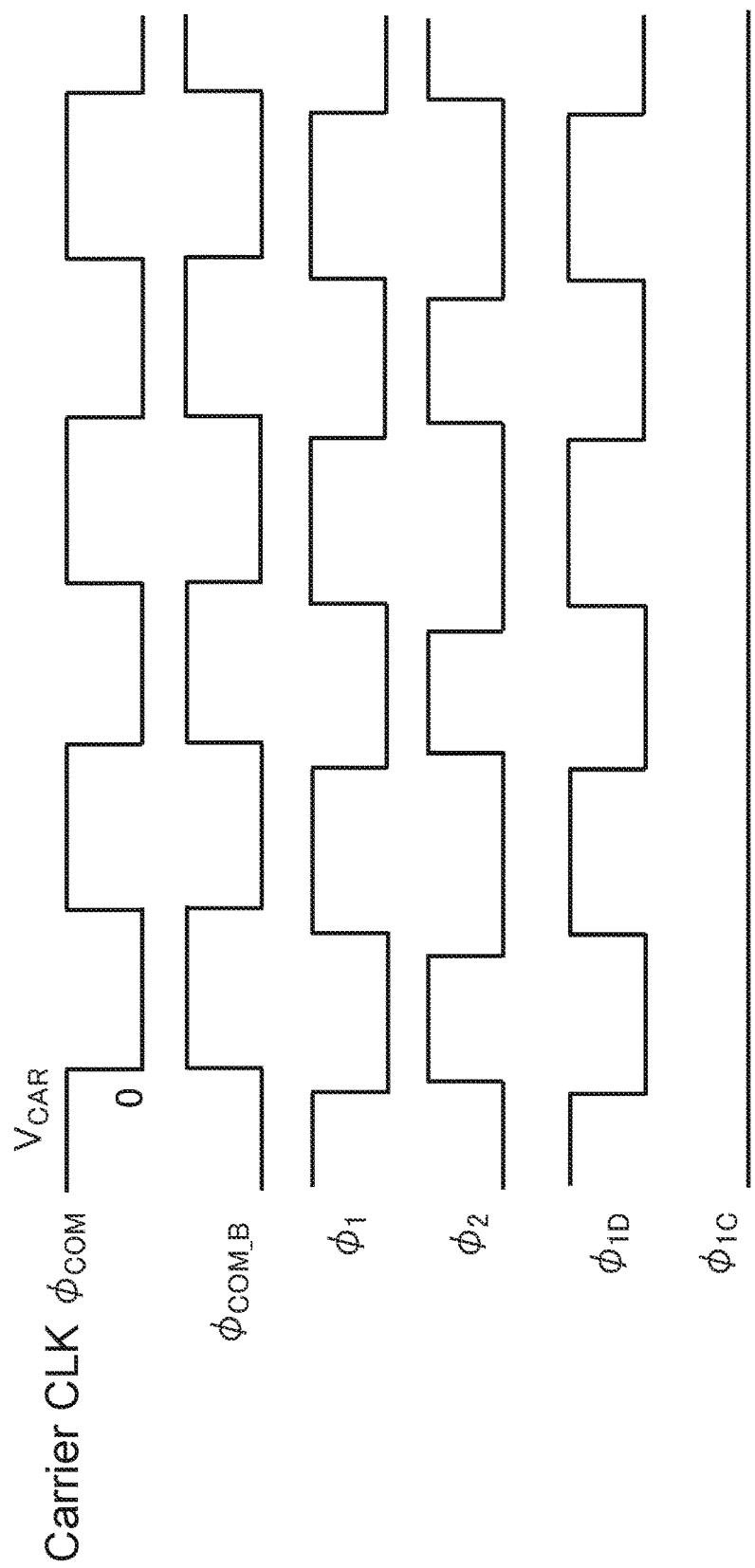
FIG. 12 is an operation timing chart of the seventh embodiment of the present invention.

FIG. 11 shows a seventh embodiment of the present invention. FIG. 12 shows an operation timing chart of the seventh embodiment. The difference from the first embodiment is the structure of a MEMS. In the embodiment, the capacitive MEMS 1 of the first embodiment is replaced by a capacitive MEMS 131. The capacitive MEMS 131 includes four detection MEMS capacitive elements 131a, 131b, 131c, and 131d. Note that, in the case of performing servo control, as illustrated in FIG. 8, MEMS capacitive elements for applying servo force may be further included.

The structure of a first pair formed of the detection MEMS capacitive elements 131a and 131b and the structure of a second pair formed of a pair of the detection MEMS capacitive elements 131c and 131d are designed so as to be as identical as possible.

Unlike the first to the sixth embodiments, the movable electrodes of the detection MEMS capacitive elements 131a, 131b, 131c, and 131d are the operational amplifier-side electrodes of these capacitive elements. On the other hand, the fixed electrodes of the detection MEMS capacitive elements 131a, 131b, 131c, and 131d are connected to the carrier clock $\phi_{COM}$, the inverted carrier clock $\phi_{COM\_B}$, the inverted carrier clock $\phi_{COM\_B}$, and the carrier clock $\phi_{COM}$, respectively.

In addition to forward charging switches 7a, 7b, 8a, and 8b similar to the first embodiment, reverse charging switches 9a, 9b, 10a and 10b similar to the second embodiment are also included. The turning on and off of the forward charging switches 7a, 7b, 8a, and 8b is controlled by a clock signal $\phi_{1D}$. The turning on and off of the reverse charging switches 9a, 9b, 10a and 10b is controlled by a clock signal $\phi_{1C}$.

The movable electrode of the detection MEMS capacitive element 131a, the movable electrode of the detection MEMS capacitive element 131b, the movable electrode of the detection MEMS capacitive element 131c, and the movable electrode of the detection MEMS capacitive element 131d are mechanically coupled to each other so that they integrally move. The movable electrodes function as one weight (a mass body). When a signal, such as an acceleration signal, is not applied to the sensor, force, such as inertial force, does not act on the weight. Thus, the weight, i.e., the movable electrode of the detection MEMS capacitive element 131a, the movable electrode of the detection MEMS capacitive element 131b, the movable electrode of the detection MEMS capacitive element 131c, and the movable electrode of the detection MEMS capacitive element 131d are located at initial sites.

The electrode structure is designed so that when the movable electrodes are located at the initial sites, the distance between the movable electrode and the fixed electrode of the detection MEMS capacitive element 131a is equal to the distance between the movable electrode and the fixed electrode of the detection MEMS capacitive element 131b. Thus, the capacitance values of the detection MEMS capacitive element 131a and the detection MEMS capacitive element 131b are supposed to be equal to each other. However, in reality, the distances are unequal to each other because of the influence of parasitic capacitance and variations in MEMSs in manufacture. The capacitance value of the detection MEMS capacitive element 131a is expressed by $C+C_{DC}+C_{DC2}$, and the capacitance value of the detection MEMS capacitive element 131b is expressed by $C-C_{DC}-C_{DC2}$.

Similarly, the electrode structure is designed so that when the movable electrodes are located at the initial sites, the distance between the movable electrode and the fixed electrode of the detection MEMS capacitive element 131c is equal to the distance between the movable electrode and the fixed electrode of the detection MEMS capacitive element 131d. Thus, the capacitance values of the detection MEMS capacitive element 131c and the detection MEMS capacitive element 131d are supposed to be equal to each other. However, in reality, the distances are unequal to each other because of the influence of parasitic capacitance and variations in MEMSs in manufacture. The capacitance value of the detection MEMS capacitive element 131c is expressed by $C-C_{DC}+C_{DC2}$, and the capacitance value of the detection MEMS capacitive element 131d is expressed by $C+C_{DC}-C_{DC2}$.

Here, $C_{DC}$ causes a shift of the center voltage level of the output of the operational amplifier of the CV conversion amplifier, but $C_{DC2}$ has no influence on a shift of the center voltage level. Thus, in FIGS. 11 and 13, $C_{DC2}$ is not included in the capacitance values. Of course, the present invention is effective regardless of the presence or absence of $C_{DC2}$.

When a signal, such as an acceleration signal, is applied to the sensor, the weight receives force, such as inertial force, which is proportional to the signal, such as an acceleration signal. Thus, the position of the weight, i.e., the positions of the movable electrode of the detection MEMS capacitive element 131a, the movable electrode of the detection MEMS capacitive element 131b, the movable electrode of the detection MEMS capacitive element 131c, and the movable electrode of the detection MEMS capacitive element 131d are integrally displaced proportional to the signal, such as an acceleration signal. Consequently, when the movable electrode of the detection MEMS capacitive element 131a is displaced so as to come close to the fixed electrode of the detection MEMS capacitive element 131a, the movable electrode of the detection MEMS capacitive element 131b conversely moves away from the fixed electrode of the detection MEMS capacitive element 131b by the same displaced amount. When the movable electrode of the detection MEMS capacitive element 131a is displaced so as to move away from the fixed electrode of the detection MEMS capacitive element 131a, the movable electrode of the detection MEMS capacitive element 131b conversely comes close to the fixed electrode of the detection MEMS capacitive element 131b by the same displaced amount. Similarly, when the movable electrode of the detection MEMS capacitive element 131c is displaced so as to come close to the fixed electrode of the detection MEMS capacitive element 131c, the movable electrode of the detection MEMS capacitive element 131d conversely moves away from the fixed electrode of the detection MEMS capacitive element 131d by the same displaced amount. When the movable electrode of the detection MEMS capacitive element 131c is displaced so as to move away from the fixed electrode of the detection MEMS capacitive element 131c, the movable electrode of the detection MEMS capacitive element 131d conversely comes close to the fixed electrode of the detection MEMS capacitive element 131d by the same displaced amount.

Suppose that the displaced amount, i.e., a change in the capacitance value caused by the amount of a change in the gap between the electrodes is $\Delta C$, the capacitance value of the detection MEMS capacitive element 131a is $C+C_{DC}+\Delta C$, the capacitance value of the detection MEMS capacitive element 131b is $C-C_{DC}-\Delta C$, the capacitance value of the detection MEMS capacitive element 131c is $C-C_{DC}+\Delta C$, and the capacitance value of the detection MEMS capacitive element 131d is $C+C_{DC}-\Delta C$.

The operation of the embodiment is basically similar to the operation of the first embodiment. Thus, differences in operations will be mainly described. As shown in the operation timing chart in FIG. 12, when $C_{DC}$ is zero or more, the clock signal $\phi_{1D}$ has a clock waveform the same as the clock waveform of the clock signal $\phi 1$, whereas the clock signal $\phi_{1c}$ is always at a low voltage. Thus, the reverse charging switches 9a, 9b, 10a and 10b are always off, and are operated for forward charging similarly in the first embodiment. However, as described above, in the embodiment, the capacitive MEMS 131 includes four detection MEMS capacitive elements 131a, 131b, 131c, and 131d, and the fixed electrodes of these elements are connected to the carrier clock $\phi_{COM}$, the inverted carrier clock $\phi_{COM\_B}$, the inverted carrier clock $\phi_{COM\_B}$, and the carrier clock $\phi_{COM}$, respectively. When the operation similar to the first embodiment is performed in this state, in a period in which the carrier clock km is at a low voltage (at zero potential), the inverted carrier clock $\phi_{COM\_B}$ is at a high voltage (the voltage value $V_{CAR}$), the clock signals $\phi_1$ and $\phi_{1D}$ are at a low voltage, and the clock signal $\phi_2$ is at a high voltage, the differential output $V_{OUT}$ and the output in-phase voltage level $V_{CMO}$ of the CV conversion amplifier are expressed as below at $V_{CM1}=V_{CM2}=V_{DD}/2$.

$$V_{OUT} = 4V_{CAR} \cdot \frac{\Delta C}{C_F} \quad \text{[Equation 19]}$$

$$V_{CMO} = \frac{V_{DD}}{2} + V_{CAR} \cdot \frac{2C_{DC} - C'}{C_F} \quad \text{[Equation 20]}$$

Thus, $C'=2C_{DC}$ is selected, i.e., the charging voltage is set to $(2C_{DC}/C_F)V_{CAR}$, and hence the second right-hand term in Equation 20 can be zero. As a result, the output in-phase voltage level $V_{CMO}$ can be $V_{DD}/2$, which is a desired value. Consequently, a sufficiently wide amplitude range of the output voltage of the CV conversion amplifier can be secured.

On the other hand, when $C_{DC}$ is zero or less, in FIG. 12, the waveform of the clock signal $\phi_{1D}$ is exchanged by the waveform of the clock signal $\phi_{1C}$. In other words, the clock signal $\phi_{1C}$ has a clock waveform the same as the clock waveform of the clock signal $\phi_1$, whereas the clock signal $\phi_{1D}$ is always at a low voltage. Thus, the forward charging switches 7a, 7b, 8a, and 8b are always off, and are operated for reverse charging similar to the second embodiment. Consequently, in a period in which the carrier clock $\phi_{COM}$ is at a low voltage (at zero potential), the inverted carrier clock $\phi_{COM\_B}$ is at a high voltage (the voltage value $V_{CAR}$), the clock signals $\phi_1$ and $\phi_{1D}$ are at a low voltage, and the clock signal $\phi_2$ is at a high voltage, the differential output $V_{OUT}$ and the output in-phase voltage level $V_{CMO}$ of the CV conversion amplifier are expressed as below at $V_{CM1}=V_{CM2}=V_{DD}/2$.

$$V_{OUT} = 4V_{CAR} \cdot \frac{\Delta C}{C_F} \quad \text{[Equation 21]}$$

$$V_{CMO} = \frac{V_{DD}}{2} + V_{CAR} \cdot \frac{2C_{DC} + C'}{C_F} \quad \text{[Equation 22]}$$

Thus, $C'=-2C_{DC}$ is selected, i.e., the charging voltage is set to $(-2C_{DC}/C_F)V_{CAR}$, and hence the second right-hand term in Equation 22 can be zero. As a result, the output in-phase voltage level $V_{CMO}$ can be $V_{DD}/2$, which is a desired value. Consequently, a sufficiently wide amplitude range of the output voltage of the CV conversion amplifier can be secured.

Eighth Embodiment

Figure 13:
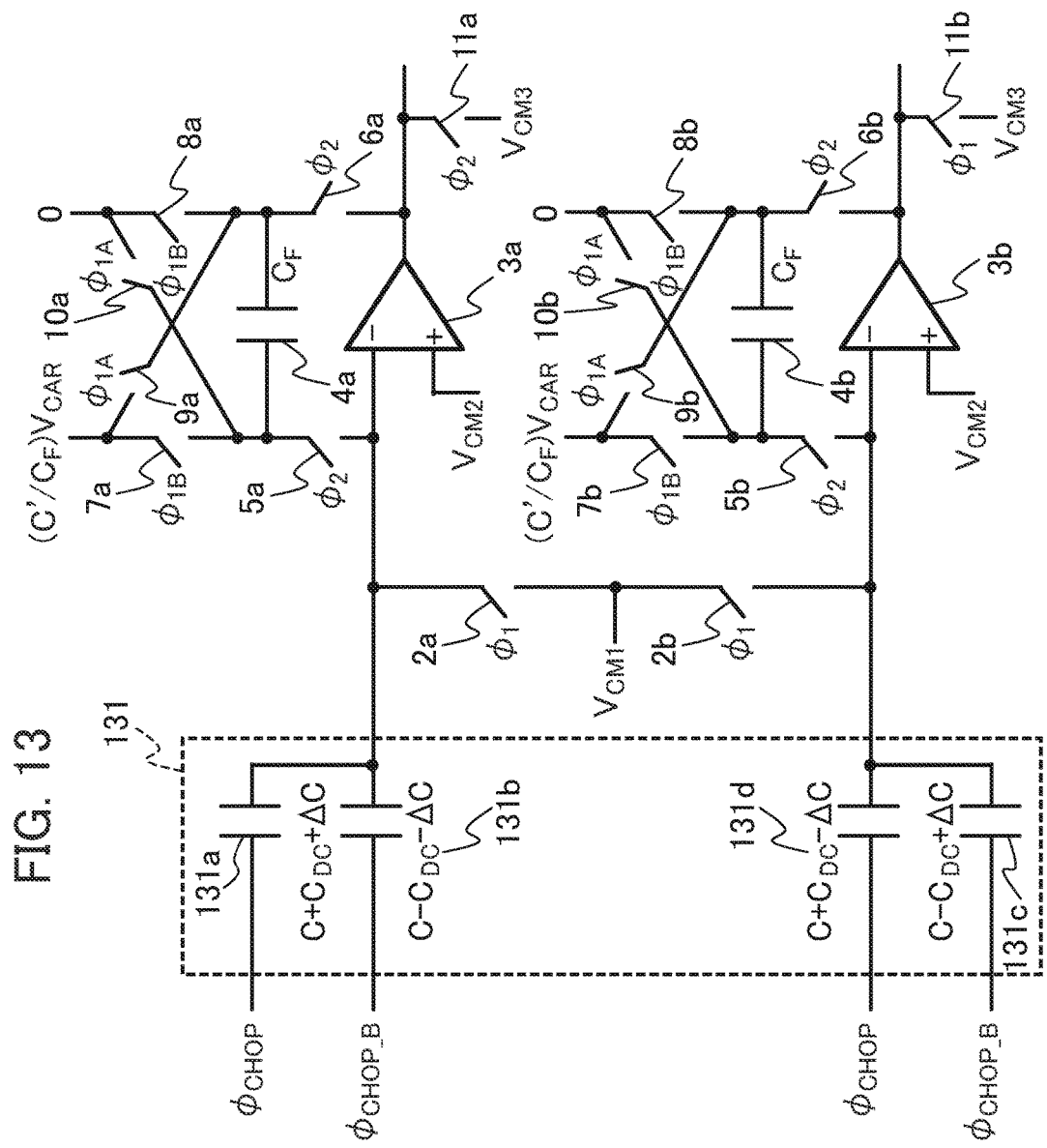
FIG. 13 is a circuit diagram of an eighth embodiment of the present invention.
Figure 14:
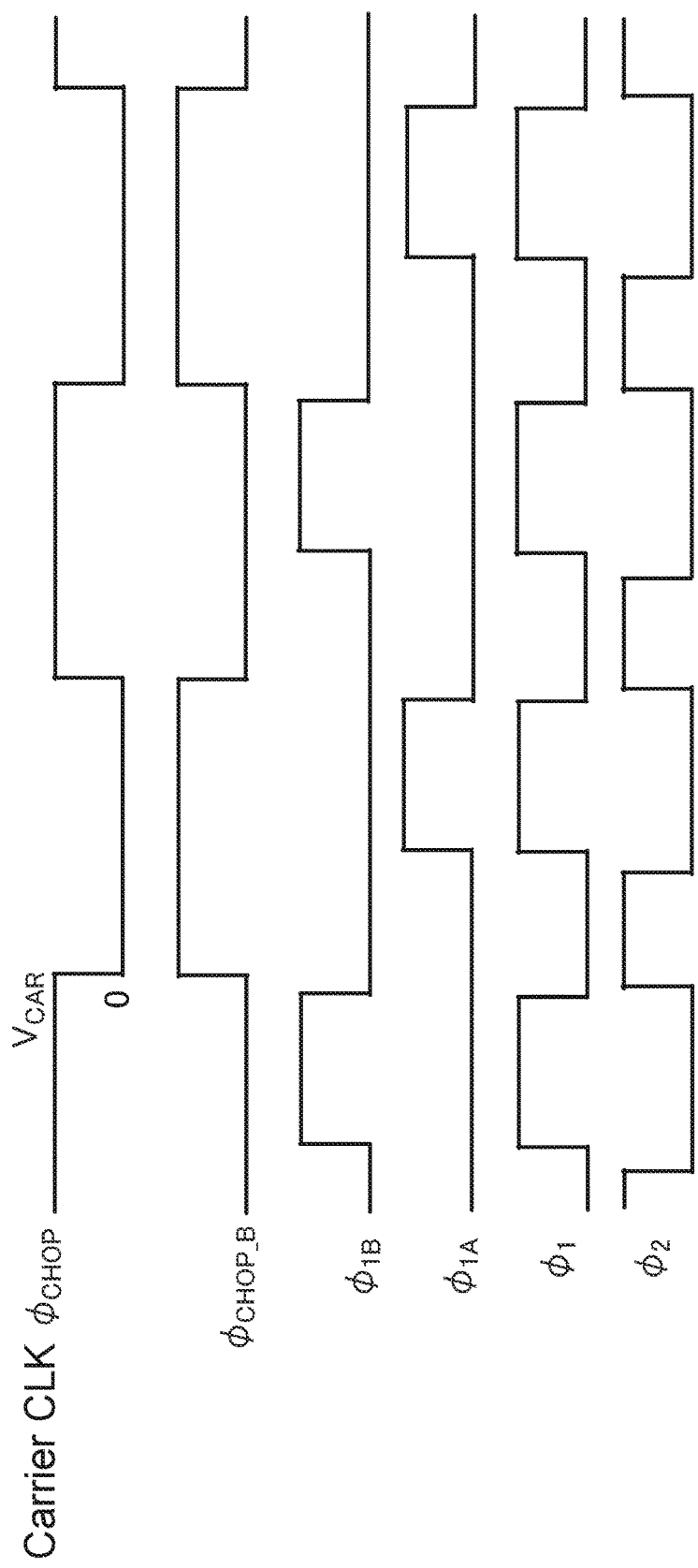
FIG. 14 is an operation timing chart of the eighth embodiment of the present invention.

FIG. 13 shows an eighth embodiment of the present invention. FIG. 14 shows an operation timing chart of the eighth embodiment. A difference from the seventh embodiment is in that an amplitude modulation function (i.e., the function of a chopper amplifier) is provided like the third embodiment. Thus, the fixed electrodes of the detection MEMS capacitive elements 131a, 131b, 131c, and 131d are connected to a carrier clock $\phi_{CHOP}$, an inverted carrier clock $\phi_{CHOP\_B}$, an inverted carrier clock $\phi_{CHOP\_B}$, and a carrier clock $\phi_{CHOP}$ in FIG. 14. In the case where $C_{DC}$ is zero or more, clock signals $\phi_{1A}$ and $\phi_{1B}$ have waveforms shown in FIG. 14, whereas in the case where $C_{DC}$ is zero or less, the waveform of the clock signal 41A is exchanged by the waveform of the clock signal $\phi_{1B}$. In this state, the detection MEMS capacitive elements 131a, 131b, 131c, and 131d are operated similarly to ones in the third embodiment. As a result, similarly to the seventh embodiment, $C'=2|C_{DC}|$ ($|C_{DC}|$ is the absolute value of $C_{DC}$) is selected, i.e., the charging voltage is set to $(2|C_{DC}|/C_F)V_{CAR}$, and hence the output in-phase voltage level $V_{CMO}$ can be $V_{DD}/2$, which is a desired value. Accordingly, a sufficiently wide amplitude range of the output voltage of the CV conversion amplifier can be secured.

Ninth Embodiment

Figure 17:
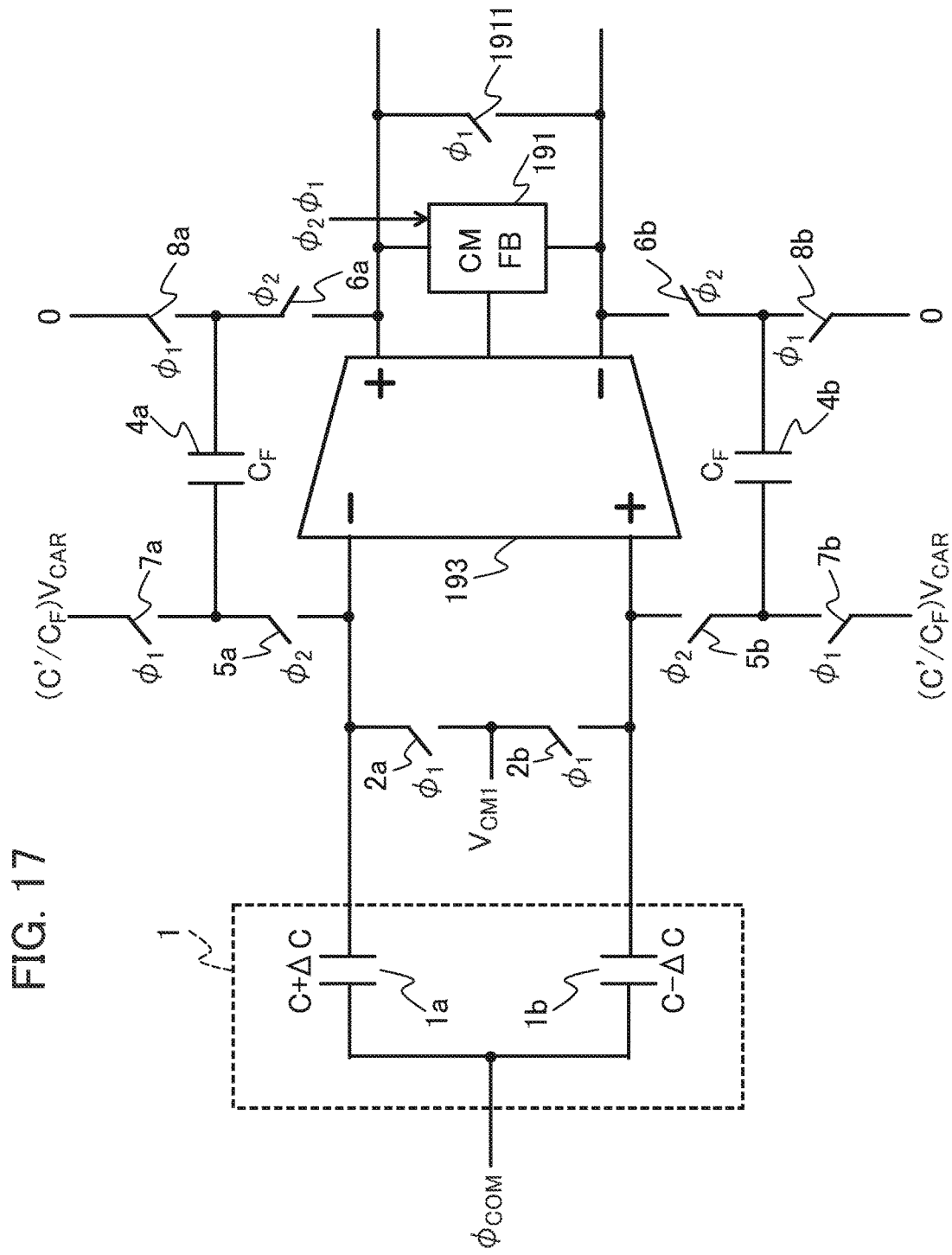
FIG. 17 is a circuit diagram of a ninth embodiment of the present invention.

FIG. 17 shows a ninth embodiment of the present invention. Operation timings are the same as ones in FIG. 2. The difference from the first embodiment is in that instead of using two single-ended output operational amplifiers 3a and 3b, one fully-differential operational amplifier (a differential output operational amplifier) 193 is used.

In this case, a common-mode feedback circuit (CMFB) 191 is often included as well, which controls the output in-phase voltage level $V_{CMO}$ ($=(V_{OUTP}+V_{OUTN})/2$) of the fully-differential operational amplifier 193 to a desired voltage level (e.g. $V_{DD}/2$), where $V_{OUTP}$ and $V_{OUTN}$ are the positive-phase output voltage and the negative-phase output voltage of the fully-differential operational amplifier 193, respectively. Thus, in the case of using the fully-differential operational amplifier, the output in-phase voltage level $V_{CMO}$ can be set to near $V_{DD}/2$. However, in return for this, the input in-phase voltage level $V_{CMI}$ ($=(V_{INP}+V_{INN})/2$) of the fully-differential operational amplifier is considerably shifted from a desired voltage level, where $V_{INP}$ and $V_{INN}$ are the positive-phase input voltage and the negative-phase input voltage of the fully-differential operational amplifier 193, respectively. Thus, this causes the faulty operation of the fully-differential operational amplifier 193. In Patent Literature 1, Nonpatent Literatures 1 and 2, for example, a capacitance for adjusting the in-phase potential is additionally provided for the input node of the fully-differential operational amplifier, securing the normal operation of the CV conversion amplifier.

Referring to FIG. 17, the configuration of the ninth embodiment will be described only on the points that are different from the configuration of FIG. 1. The movable electrodes of detection MEMS capacitive elements 1a and 1b are both connected to the carrier clock $\phi_{COM}$. The other electrodes (the fixed electrodes) are connected to the inverting input terminal and the non-inverting input terminal of the fully-differential operational amplifier 193, respectively.

Between the inverting input terminal and the positive-phase output terminal of the fully-differential operational amplifier 193, a feedback capacitive element 4a (at a capacitance value $C_F$) is connected through an input-side feedback switch 5a and an output-side feedback switch 6a. Similarly, between the non-inverting input terminal and the negative-phase output terminal of the fully-differential operational amplifier 193, a feedback capacitive element 4b (at a capacitance value $C_F$) is connected through an input-side feedback switch 5b and an output-side feedback switch 6b. The positive-phase output node and the negative-phase output node of the fully-differential operational amplifier 193 are short-circuited through an output reset switch 1911. The turning on and off of the output reset switch 1911 is controlled by the clock signal $\phi_1$. Moreover, the positive-phase output node and the negative-phase output node are connected to a common-mode feedback circuit (CMFB) 191. The output of the common-mode feedback circuit 191 is connected to the fully-differential operational amplifier 193.

Referring to the operation timing chart in FIG. 2, the operation will be described. In a period in which the carrier clock $\phi_{COM}$ is at a high voltage (the voltage value $V_{CAR}$) and the clock signal $\phi_1$ is at a high voltage, the operation of sampling switches 2a and 2b is similar to the operation in the first embodiment.

During the period in which the clock signal $\phi_1$ is at a high voltage, the operation of the forward charging switches 7a, 8a, 7b, and 8b is similar to the operation in the first embodiment. At this time, since the clock signal $\phi_2$ is at a low voltage, the input-side feedback switches 5a and 5b and the output-side feedback switches 6a and 6b are off. As a result, the fully-differential operational amplifier 193 is in an open loop state.

Therefore, when the charging voltage is $(C'/C_F)V_{CAR}$, an electric charge of $C'*V_{CAR}$ is charged on both of the operational amplifier input-side electrodes of the feedback capacitive elements 4a and 4b. The potential $V_{INN}$ of the inverting input terminal and the potential $V_{INP}$ of the non-inverting input terminal of the fully-differential operational amplifier 193 are both sufficiently close to $V_{CM1}$. However, a slight potential difference $V_{INP}-V_{INN}$ remains. Since the fully-differential operational amplifier 193 is in the open loop state, the differential output voltage $(V_{OUTP}-V_{OUTN})$ of the fully-differential operational amplifier 193 is to swing to a voltage which the potential difference between $V_{INP}-V_{INN}$ is multiplied by a large open loop gain of the fully-differential operational amplifier 193. Also in this case, the present invention effectively functions. In the embodiment, the output reset switch 1911 connected between the positive-phase output and the negative-phase output of the fully-differential operational amplifier 193 is turned on, and hence the differential output voltage $(V_{OUTP}-V_{OUTN})$ of the fully-differential operational amplifier 193 is sufficiently close to zero. Thus, this sometimes allows the CV conversion amplifier to be easily operated at high speed.

In the operation timing chart in FIG. 2, the operation is similar to the first embodiment in which at the instant in time at which the clock signal $\phi_1$ is transitioned from a high voltage to a low voltage, the sampling switches 2a and 2b are turned off, and electric charges are fixed.

As illustrated in the operation timing chart in FIG. 2, after the transition of the clock signal $\phi_1$ to a low voltage, the clock signal $\phi_2$ is transitioned to a high voltage after a lapse of a short non-overlap period, which is a period in which the clock signals $\phi_1$ and $\phi_2$ are both at a low voltage. Thus, the input-side feedback switch 5a and the output-side feedback switch 6a are turned on, and the feedback capacitive elements 4a and 4b are inserted between the input and the output of the fully-differential operational amplifier 193. Consequently, the fully-differential operational amplifier 193 is turned to a closed loop state. Therefore, because of the virtual ground operation of the operational amplifier in the closed loop state, the potential of the inverting input terminal and the potential of the non-inverting input terminal of the fully-differential operational amplifier 193 are (almost) the same.

On the other hand, as illustrated in the operation timing chart in FIG. 2, the carrier clock $\phi_{COM}$ is transitioned to a low voltage (zero potential). Thus, the potentials of the carrier clock-side electrodes of the detection MEMS capacitive elements 1a and 1b are zero. With the circuit configuration and the operation, which are widely known, the common-mode feedback circuit 191 can automatically adjust the output in-phase voltage level $V_{CMO}$ of the fully-differential operational amplifier 193 to a desired voltage level $V_{CMO\text{-}o}$ (e.g. $V_{DD}/2$). After the clock signal $\phi_1$ is transitioned to a low voltage, the total charge amount charged on the operational amplifier input-side electrode of the detection MEMS capacitive element 1a and the operational amplifier input-side electrode of the feedback capacitive element 4a is stored remaining as $-(C+\Delta C)*(V_{CAR}-V_{CM1})+C'*V_{CAR}$. Similarly, after the clock signal $\phi_1$ is transitioned to a low voltage, the total charge amount charged on the operational amplifier input-side electrode of the detection MEMS capacitive element 1b and the operational amplifier input-side electrode of the feedback capacitive element 4b is stored remaining as $-(C-\Delta C)*(V_{CAR}-V_{CM1})+C'*V_{CAR}$.

As a result of the description above, the input in-phase voltage level $V_{CMI}$ of the fully-differential operational amplifier 193 is expressed as below.

$$V_{CMI} = \frac{C \cdot V_{CM1} + C_F \cdot V_{CMO\_0}}{C + C_F} - \frac{C - C'}{C + C_F} \cdot V_{CAR} \qquad \text{[Equation 23]}$$

At $V_{CM1}=V_{CMO\_0}=V_{DD}/2$, $V_{CMI}$ is expressed as below.

$$V_{CMI} = \frac{V_{DD}}{2} - \frac{C - C'}{C + C_F} \cdot V_{CAR} \qquad \text{[Equation 24]}$$

As described above, in the embodiment, $C'=C$ is selected, i.e., the charging voltage is set to $(C/C_F)V_{CAR}$, and hence the second right-hand term in Equation 24 can be zero. As a result, the input in-phase voltage level $V_{CMI}$ can be $V_{DD}/2$, which is a desired value. Thus, the fully-differential operational amplifier 193 can be normally operated.

On the other hand, in the case where the present invention is not applied, i.e., in the case where $C'=0$ (the charging voltage is zero), the input in-phase voltage level $V_{CMI}$ is considerably decreased based on the second right-hand term in Equation 24. Thus, the MOS transistors configuring the fully-differential operational amplifier 193 have inappropriate bias potentials. As a result, the fully-differential operational amplifier 193 fails to be normally operated. Note that, in the case where a desired value of the input in-phase voltage level $V_{CMI}$ is not $V_{DD}/2$, $V_{CMI}$ can be set to a desired potential by adjusting the setting of the value C', i.e., the setting of the charging voltage, or the setting of the voltage $V_{CMI}$.

Various switches in the embodiments described above can be formed in various configurations, such as a complementary switch having an NMOS and a PMOS connected in parallel with each other, an NMOS-only switch, a PMOS-only switch, and other switches. For convenience of explanation, in any cases, a switch is turned on when a clock signal to control the switch is at a high voltage, and the switch is turned off when a clock signal to control the switch is at a low voltage.

In the foregoing embodiments, the input-side feedback switches 5a and 5b and the output-side feedback switches 6a and 6b are all included. However, these switches do not necessarily have to be included. For example, the present invention is of course effective also in the case where the input-side feedback switches 5a and 5b are included but the output-side feedback switches 6a and 6b are not included, in the case where the output-side feedback switches 6a and 6b are included but the input-side feedback switches 5a and 5b are not included, and in the case where neither the input-side feedback switches 5a and 5b nor the output-side feedback switches 6a and 6b are included.

In the foregoing embodiments described in detail, in the CV conversion amplifier or the sensor, it is unnecessary to additionally provide the capacitance for adjusting the in-phase potential at the input node of the operational amplifier. Accordingly, there can be provided a CV conversion amplifier that can secure a capacitance-to-voltage conversion gain and the amplitude range of an output voltage with a small increase in a consumption current, and a capacitive sensor using the same with low power, low noise, and a wide tolerance of input signals.

The CV conversion amplifier and the capacitive sensor according to the present invention described in the foregoing embodiments detect velocities including acceleration and angular velocity, for example, and output sensor output signals corresponding to them. These sensor output signals can be used in systems, such as ESC (Electronic Stability Control), for example, for attitude control, securing running stability, preventing skids, and the like for automobiles, two-wheel vehicles, agricultural machines, and other vehicles.

In the present specification and claims, the terms "electrode" and "wire" do not functionally limit these components. For example, "an electrode" is sometimes used as a part of "a wire", and vice versa. Moreover, the terms "electrode" and "wire" include the case where a plurality of "electrodes" and a plurality of "wires" are integrally formed, for example.

The present invention is not limited to the foregoing embodiments, and includes various exemplary modifications. For example, the configuration of an embodiment can be partially replaced by the configuration of another embodiment. The configuration of an embodiment can be additionally provided with the configuration of another embodiment. The configurations of embodiments can be partially additionally provided with, removed from, or replaced by the configurations of the other embodiments.

LIST OF REFERENCE SIGNS

1: capacitive MEMS
1a, 1b: detection MEMS capacitive element
1c, 1d: driving MEMS capacitive element
2a, 2b: sampling switch
3a, 3b: operational amplifier
4a, 4b: feedback capacitive element
4c, 4d: variable feedback capacitance
5a, 5b: input-side feedback switch
6a, 6b: output-side feedback switch
7a, 7b, 8a, 8b: forward charging switch
9a, 9b, 10a, 10b: reverse charging switch
11a, 11b: output reset switch

The invention claimed is:
1. A capacitive sensor comprising:
   a first capacitance element, a second capacitance element, a third capacitance element, and a fourth capacitance element;
   a first operational amplifier and a second operational amplifier; and
   a first switch, a second switch, a third switch, and a fourth switch, a fifth switch, and a sixth switch,
   wherein when a physical quantity to be a measurement target is not zero, a capacitance value of the first capacitance element is increased and a capacitance value of the second capacitance element is decreased;

a first electrode of the first capacitance element is connected to a first electrode of the second capacitance element, and a first signal is applied to the first electrodes;

a second electrode of the first capacitance element is connected to an inverting input terminal of the first operational amplifier;

a second electrode of the second capacitance element is connected to an inverting input terminal of the second operational amplifier;

a first electrode of the third capacitance element is connected to a first charge potential through the first switch, and a second electrode of the third capacitance is connected to a second charge potential through the second switch;

a first electrode of the fourth capacitance element is connected to a third charge potential through the third switch, and a second electrode of the fourth capacitance element is connected to a fourth charge potential through the fourth switch;

a first fixed voltage is applied to a non-inverting input terminal of the first operational amplifier, and a second fixed voltage is applied to a non-inverting input terminal of the second operational amplifier;

the first charge potential is larger than a power supply voltage of the first operational amplifier, and the third charge potential is larger than a power supply voltage of the second operation amplifier;

the first electrode of the third capacitance element is connected to the inverting input terminal of the first operational amplifier through the fifth switch;

the second electrode of the third capacitance element is connected to an output of the first operational amplifier;

the first electrode of the fourth capacitance element is connected to the inverting input terminal of the second operational amplifier through the sixth switch;

the second electrode of the fourth capacitance element is connected to an output of the second operational amplifier;

by periodically turning on the first switch and the second switch, the third capacitance element is periodically charged by a difference voltage between the first charge potential and the second charge potential; and by periodically turning on the third switch and the fourth switch, the fourth capacitance element is periodically charged by a difference voltage between the third charge potential and the fourth charge potential.

2. The capacitive sensor according to claim 1, wherein the first charge potential is set greater than the second charge potential, and the third charge potential is set greater than the fourth charge potential; or the second charge potential is set greater than the first charge potential, and the fourth charge potential is set greater than the third charge potential.

3. The capacitive sensor according to claim 2, wherein the first charge potential and the third charge potential have equal potentials; and the second charge potential has a potential equal to the fourth charge potential.

4. The capacitive sensor according to claim 1, further comprising:

a seventh switch and an eighth switch, wherein the first electrode of the third capacitance is connected to a fifth charge potential through the fifth switch, and the second electrode of the third capacitance is connected to a sixth charge potential through the sixth switch;

the first electrode of the fourth capacitance is connected to a seventh charge potential through the seventh switch, and the second electrode of the fourth capacitance is connected to an eighth charge potential through the eighth switch;

by periodically turning on the fifth switch and the sixth switch, the third capacitance is periodically charged by a difference voltage between the fifth charge potential and the sixth charge potential; and by periodically turning on the seventh switch and the eighth switch, the fourth capacitance is periodically charged by a difference voltage between the seventh charge potential and the eighth charge potential.

5. The capacitive sensor according to claim 4, wherein first timings at which the first switch, the second switch, the third switch, and the fourth switch are turned on are synchronized;

second timings at which the fifth switch, the sixth switch, the seventh switch, and the eighth switch are turned on are synchronized; and the first timing and the second timing are not overlapped with each other.

6. The capacitive sensor according to claim 4, wherein the fifth charge potential is equal to the first charge potential;

the sixth charge potential is equal to the second charge potential;

the seventh charge potential is equal to the third charge potential; and the eighth charge potential is equal to the fourth charge potential.

7. The capacitive sensor according to claim 1, further comprising:

an analog-to-digital (A/D) A/D converter connected to the output of the first operational amplifier and the output of the second operational amplifier; and a digital signal processor connected to an output of the A/D converter.

8. The capacitive sensor according to claim 7, further comprising:

an extraction circuit that extracts an average voltage of an output voltage of the first operational amplifier and an output voltage of the second operational amplifier, and inputs the average voltage to the A/D converter;

an in-phase compensation controller that accepts the average voltage subjected to digital conversion at the A/D converter as an input, and outputs a digital compensation value based on the average voltage; and an in-phase compensation D/A converter that controls the first charge potential and the third charge potential, or controls the second charge potential and the fourth charge potential based on the digital compensation value.

9. The capacitive sensor according to claim 8, further comprising:

a driving MEMS capacitive element; and a high-voltage output amplifier that outputs a high-voltage signal to the driving MEMS capacitive element, wherein the in-phase compensation D/A converter accepts the high-voltage signal of the high-voltage output amplifier as an input, and generates the first charge potential and the third charge potential or the second charge potential and the fourth charge potential.

10. The capacitive sensor according to claim 7, further comprising:
- variable capacitances as the third capacitance and the fourth capacitance;
- an extraction circuit that extracts an average voltage of an output voltage of the the first operational amplifier and an output voltage of the second operational amplifier, and inputs the average voltage to the A/D converter;
- an in-phase compensation controller that accepts the average voltage subjected to digital conversion at the A/D converter as an input, and outputs a digital compensation value based on the average voltage; and
- an in-phase compensation D/A converter that controls capacitance values of the third capacitance and the fourth capacitance based on the digital compensation value.

11. The capacitive sensor according to claim 1,
wherein the second electrode of the third capacitance element is connected to an output of the first operational amplifier directly.

12. The capacitive sensor according to claim 1,
wherein the second electrode of the third capacitance element is connected to an output of the first operational amplifier through a seventh switch.

13. The capacitive sensor according to claim 1,
wherein the second electrode of the fourth capacitance element is connected to an output of the second operational amplifier directly.

14. The capacitive sensor according to claim 1,
wherein the second electrode of the fourth capacitance element is connected to an output of the second operational amplifier through an eighth switch.

* * * * *